United States Patent [19]

Maeda et al.

[11] Patent Number: 4,671,984
[45] Date of Patent: Jun. 9, 1987

[54] PRINTED CIRCUIT BOARDS

[75] Inventors: Masahiko Maeda, Tokyo; Kazuya Nagata, Kanagawa; Taketsugu Otani, Kanagawa; Yasutoki Saito, Kanagawa, all of Japan

[73] Assignee: Showa Denko Kabushiki Kaisha, Tokyo, Japan

[21] Appl. No.: 688,924

[22] Filed: Jan. 4, 1985

[30] Foreign Application Priority Data

Jan. 5, 1984 [JP] Japan ................................. 59-29[U]

[51] Int. Cl.$^4$ ............................................. G03C 5/00
[52] U.S. Cl. .................................. 428/209; 428/461; 428/901
[58] Field of Search ....................... 428/209, 461, 901

[56] References Cited

U.S. PATENT DOCUMENTS 4,410,612 10/1983 Goff et al. ...................... 428/901 X
4,413,037 11/1983 Tobias ................................ 428/461

Primary Examiner—Nancy A. Swisher
Attorney, Agent, or Firm—Sughrue, Mion, Zinn Macpeak & Seas

[57] ABSTRACT

A flexible, heat resistant printed circuit board which comprises a laminate of:

(A) a thin-wall body having a thickness of from 3 μm to less than 5 mm which is a cross-linked product of a mixture composed of (1) at least one of an ethylene-acrylic acid copolymer and an ethylene-methacrylic acid copolymer, and (2) a saponified product of an ethylene-vinyl acetate copolymer, wherein the mixing proportion of copolymer (1) in the mixture is from 20 to 80% by weight and the mixture is cross-linked such that after extraction of the cross-linked product with a boiled toluene for three hours the amount of residue having a size of 0.1 μm or more is at least 80% by weight based on the weight of the cross-linked product, and (B) an electrically conductive metal layer having a thickness of from 100 Å to 400 μm.

The boards have excellent heat resistance, electrical insulating properties, flexibility, chemical resistance, dimensional stability, etc.

20 Claims, 26 Drawing Figures

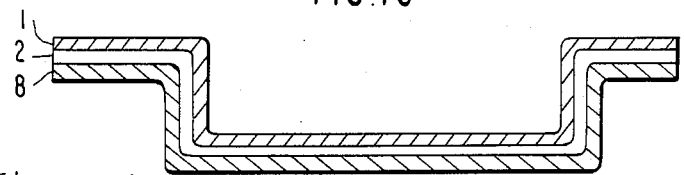
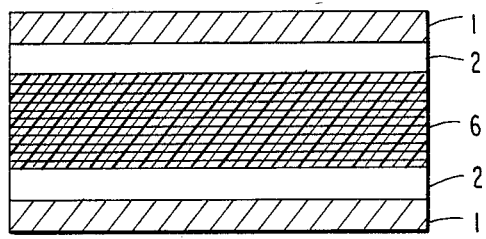
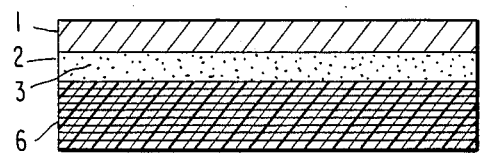
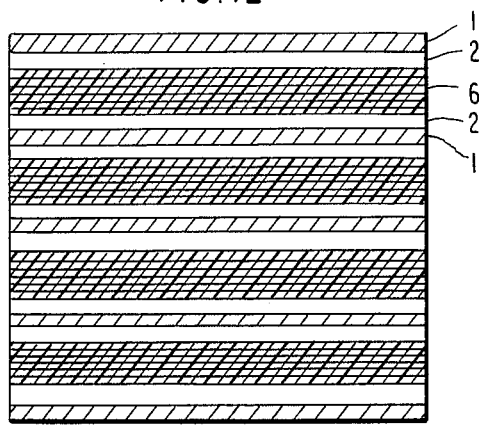
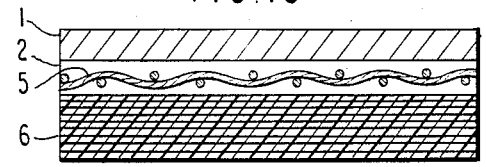
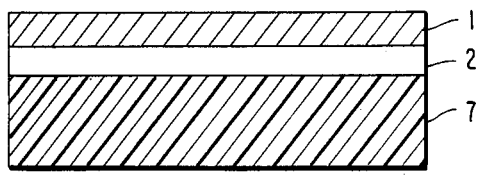
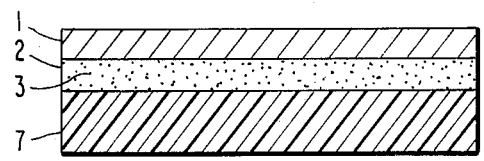
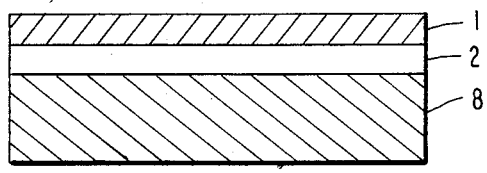
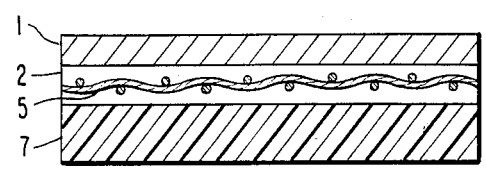
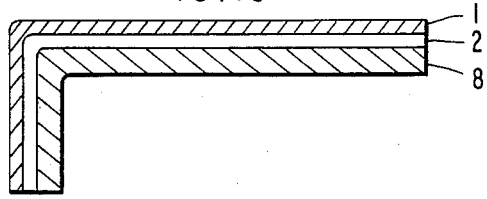

PRINTED CIRCUIT BOARDS

FIELD OF THE INVENTION

This invention relates to printed circuit boards exhibiting excellent adhesion of a metal layer forming a circuit to a substrate at temperatures of from normal room temperature (about 20° C.) to relatively high temperatures (e.g., 360° C.) and also excellent flexibility.

BACKGROUND OF THE INVENTION

Recently, electronic equipment has been rapidly developed to be more compact, more lightweight, thinner, and more densely mounted. Especially, printed circuit boards have been commercialized in equipment such as radios, etc. and are presently undergoing expanded use in industrial equipment such as telephones, electronic computers, etc., due to their ability to be mass-produced and their high reliability.

Flexible printed circuit boards were originally used as substitutes for wiring and cables, but since they have flexibility and hence not only can be highly densely mounted three-dimensionally in narrow spaces, but also can withstand repeated bendings, their uses have been expanded as circuits for movable parts of electronic equipment, cables and composite parts imparted with connector functions.

At present, those used as three-dimensional circuit materials in equipment such as cameras, electronic calculators, telephones, printers, etc., typically are formed of a flexible copper-lined board composed of a polyimide or polyester film of about 25 $\mu$m in thickness and an electrolytic copper foil or foils of about 35 $\mu$m thickness deposited on either or both surfaces thereof and having a circuit pattern formed thereon. In addition, those obtained by providing this circuit pattern with through-hole plating and further providing a coating of non-metallic substances (so called "cover-lay coating") on both surfaces or the outer layer are also used.

For currently used flexible printed circuit boards, films of a polyimide or polyester resin are generally used as a base material, as described in, for example, U.S. Pat. Nos. 4,377,652 and 3,322,881, Japanese Patent Publication Nos. 29793/72 and 40339/77, and Japanese Patent Applicaton (OPI) Nos. 1123/80 and 73034/76.

However, the polyester resin has a high degree of water absorption, and its coefficient of thermal expansion at 20°–250° C. is high, and thus it lacks through-hole connection reliability. Further, since curing is sometimes effected by a steam press at 170° C. during production, there is a tendency, when laminated, that not only the adhesion between the resin layers, but also the flexibility thereof, are lowered.

On the other hand, the polyimide film has an advantage that it can be easily soldered at an ordinary soldering temperature (260° C. or higher), but has a disadvantage that since the surface activity is low, bonding with the metal foil is very difficult. In order to solve this adhesion problem, generally a method is practiced of bonding using an adhesive after treating the film surface by chemical treatment using sodium hydroxide, a chromic acid mixture, aluminum hydroxide, etc. However, even when bonding is conducted by such a method, the board obtained generally does not have satisfactory adhesion as a printed circuit board and is poor in chemical resistance, heat resistance, etc. and thus it has various drawbacks, for example, the copper foil is loosened and comes off by etching treatment, solder flow, etc.

In a method of bonding with a metal foil using a thermosetting adhesive having good heat resistance (e.g., an epoxy resin), it is necessary to overlay the adhesive-applied polyimide film with a metal foil and cure the laminate by heating and pressure-treating by a press for about 1–20 hours, and thus there are severe problems with respect to productivity, cost, etc.

Also in the process for the production of printed circuit boards, the conventional process of etching a copper-lined laminate has begun to give way to an additive process of directly drawing a circuit pattern on a resin board by non-electrolytic plating by applying the plating technique on plastics and also a substractive process which combines such plating and an etching process. The reason why this additive process has come to be widely employed is that it is based on an effective process of simultaneously forming through-holes and pattern plating on a resin laminate which is available in a small range of variety in large quantities, and also for the last several years, the functions of reverse pattern resist inks, etc., have been improved and it has become possible to obtain highly developed fine lines. Recently, a resistless process has also been developed which comprises directly irradiating ultraviolet light on a photoreactive catalyst incorporated in an adhesive layer through a photomask to deposit metal nuclei, thus effecting nonelectrolytic plating.

However, with conventional boards composed of paper-phenolic resin, glass-epoxy resin, polyimide resin, etc., used in the above additive process, since the adhesion with the plating is poor, blisters and peel-off can occur, or since the coefficient of thermal expansion in the thickness direction is great, when thermal stress is applied, cracking often takes place, especially in a minute pattern plated part. Further, on making holes in a laminate, it is the present situation that smear (misalignment of holes through the laminate) is generated and interferes with the connection with the plating, and thus the connection reliability is deteriorated. Furthermore, in the etching or plating step, since great quantities of various aqueous solutions and washing water are used, it is an essential requirement that the dimensional change when wet be small.

Furthermore, copper-lined laminates are mainly used as printed circuit boards, and demand therefor has recently been increasing. Heretofore, a phenol resin-impregnated base material and an epoxy resin-impregnated base material have been used for the copper-lined laminates.

However, printed circuit boards employing base materials impregnated with these resins are not always satisfactory in various characteristics; for example, the adhesive power between the copper foil and the base material, the dimensional stability, and the electrical characteristics (especially electrical charactreristics after moisture absorption treatment) are greatly lowered, and so on. Therefore, they cannot fully satisfy the demands for densification and higher reliability accompanying recent developments in the electronics fields, and thus printed circuit boards having improved capabilities are anxiously desired.

For improving characteristics such as heat resistance and dimensional stability, fibrous materials have been introduced composed of glass fiber, such as glass paper, filamenta and staple fibers, or base materials obtained by impregnating glass fabrics with a phenolic resin or an improved epoxy resin has been used. However, in these circuit boards, although the dimensional stability, heat stability, etc., can be improved to some extent by the presence of these inorganic fibrous materials in the base materials, the moisture resistance, electrical characteristics, etc., cannot be substantially improved. Further, since there is no sufficient adhesive for adhering these base materials and the copper foil, it is the present situation that the improvements in the properties of the base material itself are not sufficiently manifested when the copper foil and the laminate are formed.

Further, where thermoplastic resins are used as base materials, the dimensional stability of the boards obtained is remarkably influenced by the bonding conditions using either heat fusion or the adhesive. In addition, since residual stress of the adhesive layer acts to generate shrinkage at high temperatures, bending, twisting, etc., may be brought about. In order to overcome this problem, those having a glass cloth or mat, an inorganic fiber cloth, etc. incorporated in a base material resin are employed. However, since adhesion and compatibility between the thermoplastic resin and the glass fiber are extremely poor, it is often observed that when repeatedly bent, peel-off occurs between the resin and the glass fiber, thus causing rupture, or break-down of the circuit.

Under such circumstances, there has been a demand for a printed circuit board having not only good dimensional stability at high temperatures, but also excellent electrical characteristics, and still being highly reliable and inexpensive.

In the recent years, with the advance in densification, multiple layering has been developed accordingly. In particular, in a structure of three or more layers, through-holes are utilized in order to connect different electrically conductive layers. For example, a plated through-hole process, an additive process, a multi-wire process, etc., are conducted, and the through-holes are utilized also in mounting electronic parts, for example, in a clearance process, a pin inserting process, etc.

In these through-holes, it is general to form a conductor by a plating technique, but there are problems in respect to moisture resistance, bond strength, etc. and hence disconnection occurs or the product yield is very poor, and therefore, a resin having good adhesion (i.e., as an insulating layer) has been sought.

Moreover, thermosetting resin laminates generally used as printed circuit boards have not only electrical characteristics but also heat stability, and also, by making the best use of the feature of having only a small dimensional change in the thickness direction, they are used as double-faced through-hole printed circuit boards. Heretofore, thermosetting laminates that have been used include laminates obtained by impregnating a base material such as paper, cloth, glass fiber, etc., with a thermosetting resin such as a phenolic resin, an epoxy resin, an unsaturated polyester resin, etc., then drying and thereafter laminating the desired number thereof and finally heating and pressure-treating them to mold them together using a thermal press machine. Further, a disadvantage of poor heat dissipating properties is ameliorated by incorporating a good heat conductive poder filler.

When using these thermosetting laminates as insulators for printed circuit boards, it is necessary to laminate an electrically conductive metal foil via an adhesive layer on the laminate. As the electrically conductive metal foil, an electrolytic copper foil or a milled copper foil is used. However, finding an appropriate adhesive for bonding the copper foil and the thermosetting resin is a problem. That is, in general, an epoxy resin is used as the adhesive, but since volatile substances are contained in the adhesive, not only are blisters generated and the conductive layer comes off on heating, but also the dielectric strength is decreased, and so forth. Inter alia, the greatest disadvantages are heat resistance and moisture resistance, and since such properties in the adhesive layers are poorer than those in the thermosetting laminates, it is the present situation that the desirable characteristics of the laminates cannot be fully utilized. Furthermore, since a step of coating the adhesive on the conductor or the laminate is required, the processing steps are very complicated and also there are drawbacks such as that the bonding power is reduced, by, e.g., uneven coating of the adhesive, etc., and that it takes a prolonged time for the adhesive to cure, etc.

Under such circumstances, the development of an adhesive layer which can bond a thermosetting resin laminate and a conductor and has excellent heat resistance, moisture resistance, and insulating properties has been sought.

SUMMARY OF THE INVENTION

Accordingly, the present inventors have conducted extensive investigations in order to overcome the above-described problems and provide printed circuit boards having good heat resistance and also excellent electrical insulating properties, and, as a result, have discovered a printed circuit board having excellent electrical insulating properties as well as excellent flexibility and good durability, and thereby having accomplished this invention, viz., a printed circuit board comprising a laminate of:

(A) a thin-wall body having a thickness of from 3 $\mu$m to less than 5 mm which is a crosslinked product of a mixture composed of (1) at least one of an ethylene-acrylic acid copolymer and an ethylene-methacrylic acid copolymer (hereinafter collectively referred to as "copolymer (1)") and (2) a saponified product of an ethylene-vinyl acetate copolymer (hereinafter referred to as "copolymer (2)"), wherein the mixing proportion of copolymer (1) in the mixture is from 20 to 80% by weight and the mixture is crosslinked such that after the extraction of the crosslinked product with a boiled toluene for three hours the amount of residue having a size of 0.1 $\mu$m or more is at least 80% by weight based on the weight of the crosslinked product (hereinafter referred to as "layer A"); and (B) an electrically conductive metal layer having a thickness of from 100 Å to 400 $\mu$m (hereinafter referred to as "layer B").

BRIEF DESCRIPTION OF THE DRAWINGS

A more complete appreciation of the invention will be readily obtained by reference to the following detailed description, considered in connection with the accompanying drawings, wherein:

FIG. 1 through FIG. 22 are cross-sectional views of representative examples illustrating the printed circuit board layer structures according to this invention;

DETAILED DESCRIPTION OF THE INVENTION

Figure 1:
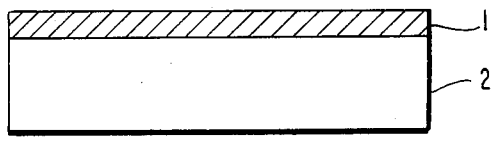

While the printed board according to this invention can be composed of two layers, i.e., layer A and layer B, in order to further improve the electrical insulating properties, dimensional stability, heat resistance, chemical resistance, flexibility, and moisture resistance of the printed circuit board obtained, it is also possible to laminate layer A and layer B with a thermosetting resin layer (hereinafter referred to as "layer C"), a heat-resistant thermoplastic resin layer (hereinafter referred to as "layer D"), and a metal layer (hereinafter referred to as "layer E"), via layer A, or it is also possible to laminate layer A and layer B with layer C, layer D and layer E via the layer A and a glass cloth or mat (hereinafter referred to as "layer F"). Alternatively, layer B and layer E may be laminated via layer A, or layer A and layer F, using the layer C or the layer D as an intermediate layer.

The printed circuit boards obtained by this invention have the following features:

(1) Since an adhesive of a thermosetting resin such as an epoxy resin is not used, a step of bonding is omitted, and complication attendant steps (drying, etc.) are also eliminated.

(2) The electrical characteristics (e.g., insulating properties, dielectric strength, dielectric loss tangent functions, etc.) are excellent.

(3) The heat resistance is good, and not only they can stand a temperature of 250° C. or higher, but also by pressure-treating at a temperature of 100° C. or higher, an electrically conductive metal thin film obtained by non-electrolytic plating or electrolytic plating may be satisfactorily bonded to the board without the use of the aforesaid adhesive.

(4) The flexibility is excellent.

(5) The chemical resistance is good.

(6) In particular, the feature of the flexible printed boards of this invention is that they can be treated to form crosslinks at a relatively high temperature (200° C. or higher) as described hereinafter as compared with the case where a polyimide film or a polyester film is used alone.

(7) The moisture resistance is excellent (the degree of water absorption is small).

(8) The tensile strength and the tear strength are great.

(9) In particular, the feature of the flexible printed board of this invention is that since they are crosslinked at a relatively high temperature (200° C. or higher) as described hereinafter as compared with the case where a polyimide film or a polyester film is used alone, not only is the dimensional stability excellent, but also the adhesion between layers A and B and the other layers is good even at high temperatures, and further the number of voids remaining is extremely small.

(10) Since it is not necessary to coat a primer used when bonding a thermoplastic resin film which is an insulating material and a metal foil or a metal plate for producing ordinary printed circuit boards, the laminating step may be easily conducted.

Further, the printed circuit boards thus obtained may be subjected to bend processing and draw processing. The thus processed printed circuit boards (hybrid integrated circuit boards) have the following features:

(1) The heat dissipating properties of the metal plate are effectively utilized and the reliability of the insulating film is remarkably increased.

(2) The processability is good, and bend processing and draw processing are possible, thus simplifying the production process.

(3) Although the primer is not used, the adhesion of the crosslinked product to the metal plate or the metal foil is remarkably excellent, and furthermore, since the crosslinking capability is retained even at high temperatures (about 360° C.), the adhesion at high temperatures is excellent.

(4) As in the case of conventional printed circuit boards, it is possible to form a circuit by etching, and thereafter conducting bend processing, or draw processing using a mold.

As described above, the printed circuit boards of this invention possess good dimensional stability, heat resistance, chemical resistance, moisture resistance, etc., as well as the electrical characteristics such as insulation resistance, dielectric constant, etc., required of the printed circuit boards of this invention, and also the folding endurance of the flexible boards exhibits flexibility which has not hitherto been obtained with the conventional boards. Further, good adhesion with the metal foil is obtained by heat contact bonding at up to relatively high temperatures (about 360° C.).

Since the printed circuit boards and products incorporating such obtained according to this invention manifest the above-described features, they may be used as hybrid IC (integrated circuit) boards, electrically insulating heat-conductive boards for semiconductors, boards for switching regulators, boards for chip carriers, boards for thyristors, boards for transistor arrays, etc.

This invention is more particularly described below with respect to the respective constituting components.

(A) Crosslinked Thin-wall Body

The crosslinked thin-wall body according to this invention is, as described hereinafter, obtained by crosslinking a thin-wall body composed of a mixture of (1) at least one of an ethylene-acrylic acid copolymer and an ethylene-methacrylic acid copolymer and (2) a saponified product of an ethylene-vinyl acetate copolymer, optionally further mixed with a heat-conductive inorganic filler, glass fiber, or a glass cloth or mat. In forming the mixture and the thin-wall body, it is essential to substantially inhibit crosslinking of the copolymer (1) and copolymer (2) (that is, to preclude formation of fish-eyes), and in producing the printed circuit board of this invention, the crosslinking of the thin-wall body is effected.

(1) Ethylene-Acrylic Acid Copolymer and Ethylene-Methacrylic Acid Copolymer

The ethylene-acrylic acid copolymer and/or ethylene-methacrylic acid copolymer used in this invention may be obtained by copolymerizing ethylene and acrylic acid or ethylene and methacrylic acid at a high pressure (generally 50 kg/cm$^2$ or higher, and preferably 100 kg/cm$^2$ or higher) in the presence of a free radical generator (generally an organic peroxide). The copolymerization proportion of the acrylic acid or methacrylic acid in the copolymer is generally from 1 to 50% by weight, and preferably from 5 to 50% by weight. If the proportion is less than 1% by weight, a uniform thin-wall body cannot be obtained. On the other hand, if it exceeds 50% by weight, the softening point is too low, and handling and transfer are inconvenient.

(2) Saponified Product of Ethylene-Vinyl Acetate Copolymer

The saponified product of an ethylene-vinyl acetate copolymer used in this invention is obtained by saponifying (hydrolyzing) an ethylene-vinyl acetate copolymer. The hydrolysis is generally conducted using sodium hydroxide in methyl alcohol. On producing the saponified product of this invention, that having a degree of hydrolysis of 90% or higher is generally desired. The ethylene-vinyl acetate copolymer starting material is obtained by copolymerizing ethylene and vinyl acetate in a manner similar to that for the aforesaid ethylene-acrylic acid copolymer and ethylene-methacrylic acid copolymer. The copolymerization proportion of the vinyl acetate in the ethylene-vinyl acetate copolymer is generally from 1 to 60% by weight, and preferably from 5 to 50% by weight. If the proportion is less than 1% by weight, a uniform thin-wall body cannot be obtained. On the other hand, if it exceeds 60% by weight, the softening point is reduced, and handling at room temperature is difficult.

These ethylene-acrylic acid copolymer, ethylene-methacrylic acid copolymer, and saponified product of the ethylene vinyl acetate copolymer are industrially produced products, used in various fields, and their production processes are well known. (See *Encyclopedia of Polymer Science and Technology*, Vol. 2, pp. 485–525.)

(3) Mixing Proportion

The mixing proportion of copolymer (1) in the mixture according to this invention is from 20 to 80% by weight (that is, the mixing proportion of the saponified product of the ethylene-vinyl acetate copolymer is accordingly from 80 to 20% by weight), preferably from 25 to 75% by weight, and especially preferably from 30 to 70% by weight. If the mixing proportion of copolymer (1) in the mixture is less than 20% by weight, since the number of carboxyl groups (—COOH) is small as compared with the number of hydroxyl groups (—OH), the hydroxyl groups not participating in the condensation reaction would remain and thus deteriorate the heat resistance. On the other hand, if it exceeds 80% by weight, on the contrary, since the number of carboxyl groups participating in the condensation reaction is too great and hence unreacted carboxyl groups would remain, the heat resistance and the moisture resistance cannot be improved, and thus such is not desired.

(4) Mixing Method

For mixing the mixture according to this invention, such may be carried out by uniformly mixing copolymer (1) and copolymer (2). The mixing may be carried out, for example, by dry blending using a conventional mixer such as a Henschel mixer, or by melt kneading using a mixer such as a Banbury mixer, kneader, roll mill, screw type extruder, etc. It is also possible to dry blend beforehand and melt knead the resulting mixture to produce a uniform mixture. It is required that the carboxyl groups (—COOH) contained in copolymer (1) used in the melt kneading and the hydroxyl groups (—OH) contained in copolymer (2) used therein undergo substantially no crosslinking reaction (condensation reaction), and no small particles of gelled product, a so-called "fish-eye", are generated in the mixture (slight cross-linking is permissible). From this point, the melting temperature is such that copolymers (1) and (2) melt, but that the cross-linking reaction does not take place (fish-eye is not generated). Although the melting temperature varies depending on whether a crosslinking accelerator as described hereinafter is present or not, and on its kind and the amount added, if no crosslinking accelerator is added, the melting temperature is generally up to 180° C., and particularly preferably from 100° to 150° C. If it is lower than 100° C., these copolymers do not completely melt, and thus a temperature lower than 100° C. is not desired. On the other hand, where a crosslinking accelerator is incorporated, the melting temperature is generally from 100° to 140° C.

The thus obtained mixture is substantially not crosslinked such that when subjected to extraction in a boiled toluene for three hours, the amount of residue (corresponding to fish-eye) is generally not more than 15% by weight, preferably not more than 10% by weight, more preferably not more than 5% by weight, based on the weight of the mixture. If it is more than 15% by weight, the mixture is difficult to form into a thin-wall body (e.g., film and sheet) as described below.

On producing this mixture, it is possible to add additives usually employed in the field of olefinic polymers, for example, stabilizers against oxygen, light (UV) and heat, metal deterioration inhibitors, flame retardants, electrical characteristics improvers, antistatic agents, lubricants, processability improvers, tackiness improvers, etc., in amounts which do not adversely influence the characteristics of the thin-wall body of this invention. Further, by adding a crosslinking accelerator such as epoxy compounds, p-toluenesulfonic acid, aluminum-isopropoxide, etc., the crosslinking of copolymer (1) and copolymer (2) can be further fully completed. The amount thereof is generally at most 0.1 part by weight, preferably from 0.01 to 0.05 part by weight, per 100 parts by weight of these copolymers.

(5) Production of Thin-wall Body

Where the thin-wall body of this invention is used in a film or sheet form, a thin-wall body may be obtained by an extruder widely employed when producing films by the T-die film inflation process generally used in the field of thermoplastic resins. Further, that made into a laminate may also be used. On such occasion, the extrusion temperature is not higher than 250° C. If the extrusion is effected at a temperature higher than 250° C. the copolymer (1) and copolymer (2) partially crosslink, generate fish-eye; thus a uniform extruded product cannot be obtained. Therefore, the extrusion temperature, whether a crosslinking accelerator is incorporated or not, the temperature range similar to that for the above-described melt kneading is employed.

In any of the above-described cases, after producing the thin-wall body, by rapidly cooling it by a water-cooled roll or in a water tank in order to prevent adhesion of the thin-wall bodies to each other or between the thin-wall body and the take-off roll, a thin-wall body having good transparency may be obtained. The thickness of the thus obtained thin-wall body is from 3 $\mu$m to less than 5 mm, and preferably from 10 $\mu$m to 1 mm taking into consideration the flexibility and the insulating properties, and particularly preferably from 10 to 400 $\mu$m.

(6) Heating and Pressure-treating

Since the thin-wall body obtained as above is substantially not crosslinked, it exhibits the same behavior as the ordinary thin-wall body. In order to impart the thin-wall body with the aforesaid heat resistance, the thin-wall body is subjected to heating and pressure-treating at a temperature in the range of from 100° to 400° C. and a pressure of at least 5 kg/cm$^2$, preferably from 10 to 500 kg/cm$^2$ and more preferably from 15 to 200 kg/cm$^2$. By heating and pressure-treating for from 20 to 30 minutes when the heating temperature is in the range of from 100° to 160° C., or for from 10 to 20 minutes when in the range of from 160° to 240° C., or for from 0.1 to 10 minutes when in the range of from 240° to 400° C., the crosslinking reaction (condensation reaction) takes place within the thin-wall body and the heat resistance is remarkably improved.

In other words, the mixture of copolymer (1) and copolymer (2) exhibits thermoplasticity at a temperature of not higher than 250° C., but it undergoes crosslinking by heating and pressure-treating the mixture at 160° C. or higher, whereby a laminate having excellent heat resistance may be obtained.

By heating and pressure-treating as classified above, the thin-wall body is crosslinked such that after the extraction of the crosslinked product with a boiled toluene for three hours the amount of the resulting residue having a size of 0.1 $\mu$m or more is at least 80% by weight, preferably not less than 85% by weight, more preferably 90% by weight or more, based on the weight of the crosslinked product.

In order to obtain printed circuit boards having excellent adhesion between the thin-wall body with the other layers (e.g., the electrically conductive metal layer), it is particularly preferred that the heating and pressure-treating be carried out when laminating the uncrosslinked thin-wall body with the other constituent components (e.g., a metal foil or plate, a heat resistant polymer, a thermosetting resin, etc.), as described hereinafter.

(7) Inorganic Filler

In this invention, the inorganic filler which can be incorporated in the mixture of copolymer (1) and copolymer (2) generally has a thermal conductivity of $1 \times 10^{-3}$ cal/°C.cm.sec or more and an electrical resistance value of $10^{10}$ $\Omega$ cm or more, and occupied from 5 to 70% of the total volume and preferably from 20 to 60% of the total volume. If the amount filled is less than 5% of the volume, improvement in the thermal conductivity is not manifested, whereas if it exceeds 70% by volume, although the thermal conductivity is improved, the bonding ability is lowered, and thus it is not preferred. While any inorganic filler can be used which has a thermal conductivity of $1 \times 10^{-3}$ cal/°C.cm.sec. or more and an electrical resistance value of $10^{10}$ $\Omega$ cm or more, representative examples thereof include beryllium oxide, boron nitride, magnesium oxide (magnesia), aluminum oxide (alumina), silicon carbide, and glass beads. The particle diameter of the powder of the inorganic filler is desirably not greater than 100 $\mu$m, and preferably is from 0.1 to 20 $\mu$m. If the particle diameter is less than 0.1 $\mu$m, it is difficult to uniformly disperse in the aforesaid mixture. On the other hand, if it exceeds 100 $\mu$m, the resulting layer A becomes too thick, and the bond strength is lowered, and thus such thickness is not desirable.

(8) Glass Fibers

The glass fiber which can be incorporated in the mixture of copolymer (1) and copolymer (2) generally have a fiber length of at least 0.5 mm, preferably from 1.0 to 50 mm, more preferably from 5 to 30 mm, and particularly preferably from 5 to 20 mm. If glass fibers having a fiber length of less than 0.5 mm are used, even if the amount of the glass fiber added is increased, the dimensional stability of the treated product obtained is poor, and moreover a printed circuit board having appropriate flexibility cannot be obtained. On the other hand, if a glass fiber having a fiber length of greater than 50 mm is used, it is difficult to uniformly disperse it, and thus processability is lowered. Further, a glass fiber treated with a silane compound, etc., may be preferably used.

The proportion of the glass fiber per 100 parts by weight of the total weight of copolymers (1) and (2) is at most 200 parts by weight, desirably from 5 to 150 parts by weight, and particularly preferably from 10 to 100 parts by weight. If the proportion of the glass is less than 5 parts by weight, the improvement in the dimensional stability is not sufficient. On the other hand, if it is incorporated in an amount of more than 200 parts by weight, the flexibility of the printed circuit board is lost, and when bent, it tends to remains bent and does not return to the original form.

Representative methods of mixing are described below.

A first method is to mix copolymer (1) and copolymer (2) beforehand, and then mix glass fiber into the obtained mixture.

A second method is to mix either copolymer (1) or copolymer (2) with glass fiber, and then mix the obtained mixture and the remaining mixing components.

A third method is to simultaneously mix all of the mixing components.

(9) Glass Cloth and Mat

The glass cloth and mat which can be used in this invention include those typically employed in the glass fiber industry, i.e., roving cloth, chopped strand mat, glass cloth, etc. The glass cloth includes plain weave, twill weave, satin weave, designed weave, gauze weave, etc., of which the plain weave is preferred, and the density of the warp and weft is desirably from 10 to 20 lines/25 mm, preferably from 12 to 20 lines/25 mm, and more preferably from 15 to 18 lines/25 mm. In general, mats of 100 g/m$^2$ or less are used in 3- to 10-layered laminates, and in this invention, those obtained by laminating to a value of 300 g/m$^2$ or more are preferably used. Further, it is preferred to use those imparted with general stopping treatment, or further cleaning treatment or silane treatment for further improving the compatibility with the synthetic resin used.

The weight per square meter of the glass cloth or mat used in this invention is generally 300 g or more, preferably from 300 to 700 g, and particularly preferably from 350 to 700 g. If a glass cloth or mat of less than 300 g per square meter is used, flexibility of the thin-wall body obtained is lost, and hence peel-off from the conductive material, cracking, etc. are generated upon bending, and thus a weight per square meter of less than 300 g is not preferred.

(B) Electrically Conductive Metal Layer

Electrically conductive metal layers that can constitute the printed circuit board of this invention are roughly classified into a metal foil and a metal layer obtained by metal plating or metal deposition. Although the thickness varies depending on whether it is either of the above-mentioned, it is generally from 100 Å (10 nm) to 400 μm, preferably from 10 nm to 350 μm, and particularly preferably from 15 to 350 μm. Further, the electrical conductivity is generally from $10^{-7}$ to $2\times10^{-1}$ Ω, preferably from $10^{-7}$ to $1\times10^{-1}$ Ω, and particularly preferably from $2\times10^{-7}$ to $1\times10^{-1}$ Ω.

(1) Metal Foil

The thickness of the metal foil used in this invention is generally from 5 to 400 μm, preferably from 15 to 100 μm, and particularly preferably from 15 to 50 μm. As the metal for the metal foil, electrically conductive metals, such as copper, nickel and aluminum, and alloys mainly comprising these metals are preferred, and in particular, an electrolytic copper foil of from 15 to 40 μm in thickness is particularly preferably used.

(2) Non-electrolytic Plating

As non-electrolytic plaing, i.e., chemical plating, nickel plating, highly corrosion-resistant zinc-nickel alloy plating, copper plating, etc., are generally known and can be used herein, but for a printed circuit board, copper sulfate plating is usually practiced, because it can provide a uniformly thick and dense plating on the entire surface contacted with the treating solution and it gives particularly excellent adherence and ductility between the material (board) and the plating. By such copper sulfate plating, the crystals are minute, and leveling (uniform thickness) is imparted, and at the same time stabilized processability and excellent physical characteristics may be obtained.

In general, the copper sulfate plating is effected by supplying metal copper to the solution and using copper sulfate and sulfuric acid in order to enhance the electrical conductivity and uniform electrodepositing properties of the solution. Further, chlorine ions (as a catalyst) and an appropriate amount of a brightener are used. Furthermore, in order to promote leveling, a polyoxyethylene or polyoxypropylene derivative is sometimes used. A representative composition contains from 5 to 40 g of copper sulfate ($CuSO_4.5H_2O$) in one liter of an aqueous solution, using sodium hydroxide (NaOH), ammonium chloride ($NH_4Cl$), etc., as a pH adjusting agent (buffer), disodium ethylenediaminetetraacetate (EDTA-2Na) for preventing abnormal deposition of the copper in the aqueous solution, and formaldehyde (HCHO) as a reducing agent. In addition, it is also possible to effect surface protection or corrosion prevention by providing electro-plating of copper, nickel, gold, etc., on the conductive surface (conduit) of these chemical (non-electrolytic) platings or to mount soldering on the conductive conduit through a soldering bath.

(3) Deposition

As the method of depositing a metal, generally employed vacuum heating deposition such as resistance heating, electronic radiation heating, induction heating, heat radiation heating, etc., or sputtering may be used. As the metal depositing material, such metals as aluminum, gold, copper, nickel, platinum, etc., and alloys (e.g., stainless steel) mainly comprising these (50% by weight or more) may be used. Especially, for a minute circuit, platinum and gold are often used, and where a circuit is formed by etching after forming a thin film, copper and aluminum and an alloy mainly comprising these are preferably used.

While the thickness of the conductor thin film deposited may be freely selected depending on the conditions of the device used, it is generally from 100 Å to 100 μm, and particularly desirably is from 1000 Å to 20 μm.

Further, it is also possible to effect surface protection or corrosion prevention by providing electroplating of copper, nickel, gold, etc., on the conductive surface or to mount soldering on the conductive surface through a soldering bath.

(C) and (D) Thermosetting Resin Layer and Heat-resistant Thermoplastic Resin Layer The thermosetting resin layer and heat-resistant thermoplastic resin layer constituting the printed circuit board of this invention are those obtained from the following thermosetting resins, polyimides polyesters, and other heat resistant polymers. The thickness thereof is generally from 0.005 to 4 mm, and particularly preferably from 0.01 to 2 mm.

(1) Thermosetting Resin Layer

The thermosetting resin layer according to this invention may be a laminate of a thermosetting resin or a laminate impregnated with a thermosetting resin. As the thermosetting resin, a phenolic resin, an epoxy resin, and an unsaturated polyester resin may be used. These thermosetting resins are well known, as described in, for example, *Encyclopedia of Polymer Science and Technology*, Vol. 10 pp. 1–72, Vol. 6 pp. 209–270 and Vol. 11 pp. 129–168. The thickness of the layer is generally 0.6 to 4.0 mm, and preferably from 0.8 to 3.2 mm. It is also possible to laminate glass fiber such as glass fiber, staple fiber, etc., weighing from 20 to 200 g/m² and having a thickness of 30–200 μm, or to laminate fibrous materials such as an organic fiber, carbon fiber, etc., impregnated with a thermosetting resin. In addition, these fibrous materials may be used together with pulp by making into paper by a wet paper making process similar to the ordinary paper making process. Further, in order to enhance the electrical characteristics of the glass paper, it is also possible to use that treated with an epoxy resin, an alkyd resin, an ethylene-vinyl acetate copolymer, etc., or by the so-called silane treatment, for improving the impregnation of the aforesaid thermosetting resin. Representative examples include glass cloth-based epoxy resin laminates for copper lining, etc., specifically those expressed as GE2, GE2F, GE4, and GE4F by JIS designation, paper-based phenolic resin laminates for copper lining, paper-based epoxy resin laminates for copper lining, etc.

(2) Polyimide Film

Polyimide film may be used as the heat-resistant thermoplastic resin layer. The thickness of the polyimide film used in this invention is generally from 20 μm to 2.0 mm, preferably from 50 μm to 1.6 mm, and particularly preferably from 100 μm to 1.6 mm. The polyimide film is generally obtained by casting a polyimide acid solution prepared by a low temperature solution polymerization process, drying and further subjecting to a dehydration ring-formation reaction. Further according to this invention, a polyamideimide having an amide group in the polymer backbone of the aforesaid polyimide may also be preferably employed. The general formula of the polyimide is shown by the following formula (I), and that of the polyamideimide by formula (II). These polymers are described in detail in *Encyclopedia of Polymer Science and Technology*, Vol. 11 pp. 247–272 and U.S. Pat. No. 4,377,652.

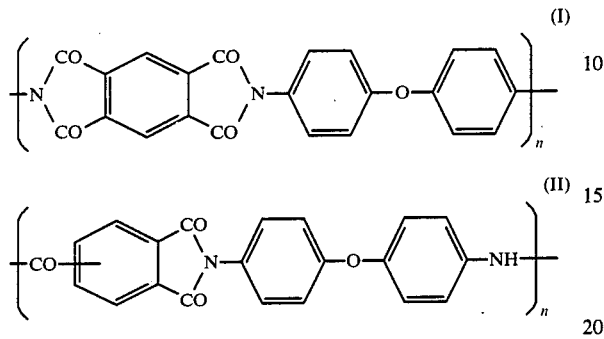

wherein n is 5 to 200.

(3) Polyester Film

Polyester film may also be used as the heat-resistant thermoplastic resin layer. The thickness of the polyester film used in this invention is generally from 20 μm to 2.0 mm, preferably from 50 μm to 1.6 mm, and particularly preferably from 100 μm to 1.6 mm. The polyester is a polymer compound containing an ester bond

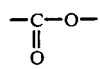

in the constituent molecular chain and having an aromatic ring in the chain unit of the polymer. This is a polymer or copolymer obtained by the condensation reaction of an aromatic dicarboxylic acid or an ester-forming derivative thereof (which may be replaced by up to 40 molar % of an aliphatic dicarboxylic acid or an alicyclic dicarboxylic acid) and an aliphatic diol having from 2 to 20 carbon atoms or an ester-forming derivative thereof (which may be replaced by up to 50 molar % of a long-chain glycol having a molecular weight of from 400 to 6,000). This polyester has an intrinsic viscosity in the range of from 0.4 to 1.5, and preferably from 0.4 to 1.3, as measured at 30° C. in a 1/1 (ratio by weight) mixed solvent of phenol and tetrachloroethane. Representative polyesters are polyalkylene terephthalate resins, which are widely used, such as polyethylene terephthalate, polypropylene terephthalate, and polybutylene terephthalate. These polyesters are described in *Encyclopedia of Polymer Science and Technology*, Vol. 11, pp. 42–120.

As this polyester film, Mylar by E. I. Du Pont (U.S.A.), Lumilar by Toray (Japan), Q Film by Teijin (Japan), etc., are well known.

(4) Other Heat Resistant Polymers

Heat resistant polymers having a glass transition temperature (hereinafter referred to as Tg) of from 200° to 400° C. may also be used in the invention and they include those having the following polymer backbones: Examples of those having an amide bond as the skelton structure include:

poly-m-xyleneadipoamide which is a polycondensate of xylenediamine and adipic acid

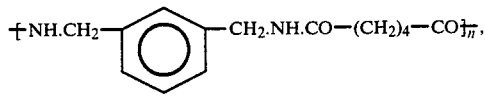

poly-p-benzamide (Tg 230° C. or higher)

poly-p-phenylene terephthalamide (Tg 345° C.)

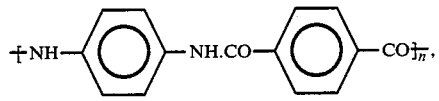

poly-m-phenylene isophthalamide (Tg 230° C. or higher)

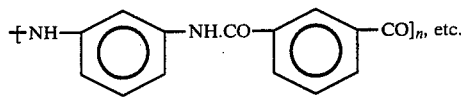

Examples of those having an ester bond as the skelton structure include polyacrylate obtained by the polycondensation of bisphenol A and isoterephthalic acid chloride

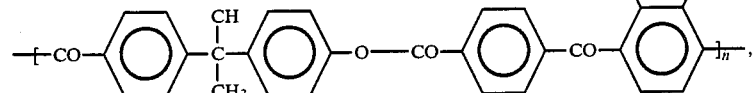

polyoxybenzoate copolymer of a condensate of p-hydroxybenzoic acid 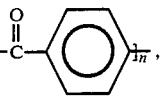

aromatic polyester carbonate which is a condensate of bisphenol A, phosgene and isoterephthalic acid chloride

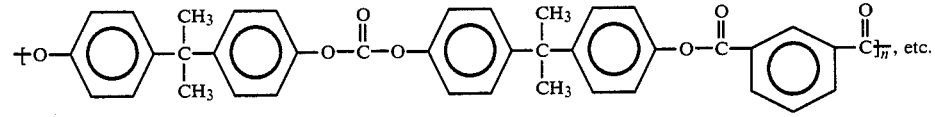

Examples of those having an ether bond as the skelton structure include polyoxymethylene
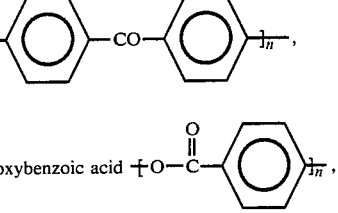

-continued polyphenylene oxide
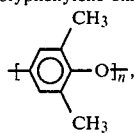

polyether sulfone
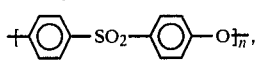

polysulfone
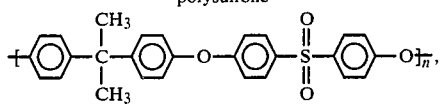

polyether ether ketone
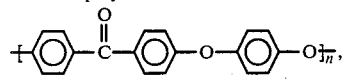

polyphenylene sulfide
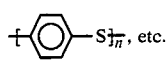

Other examples include

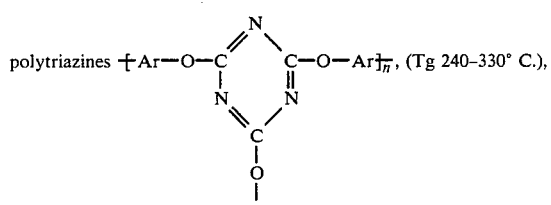

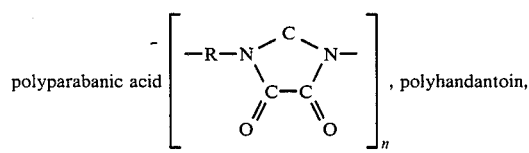

polyazomethine, polydistyrylpyradine, etc.

(E) and (F) Other Constituent Components

As the other constituent components, the following metal plate or foil, glass cloth and mat may be used for layer E or F.

(1) Metal Plate

The metal plate used in this invention is that which may be bend and draw processed and also has a function of dissipating heat, and that having a thickness of from 0.1 to 3 mm is preferred; more preferably the thickness is from 0.1 to 2.5 mm. As the metal material, metals such as aluminum, copper, iron, etc., and alloys mainly comprising these metals (e.g., stainless steel) may be used. Using a metal plate such as an iron plate, a copper plate, etc., and also utilizing the magnetic effect, the products are apparently useful for motor magnetic circuits, communication circuit switches, electronic switching systems, heat dissipation plates, etc.

(2) Metal Foil, Glass Cloth and Mat

The metal foil, glass cloth and mat used for layer E or F are the same as those described in the earlier portion of the specification, except that the thickness of the metal foil layer is generally 5 to 200 μm, preferably 5 to 100 μm and more preferably 10 to 70 μm and that the weight of the glass or mat is generally not more than 300 g/m², preferably 50 to 250 g/m² and more preferably 50 to 200 g/m².

I. Process for the Production of Printed Circuit Boards

The process for the production of printed circuit boards by this invention may be roughly classified into the following processes if an electrically conductive metal foil or plate is used as the electrically conductive metal layer (layer B) (i.e. the production is effected without metal plating or metal deposition).

A first process comprises inserting the thin-wall body of the substantially uncrosslinked mixture produced as described above between the aforesaid electrically conductive metal foils or plates per se or between the electrically conductive metal foil or plate and the auxiliary layer, C, D, E or F (which may be used singly or as two or more layers) and subsequently heating and press-treating at a temperature and a pressure in the ranges described hereinabove. On that occasion, where air, etc., is involved between the thin-wall body of the mixture and the auxiliary layer (sometimes not used) or between the electrically conductive metal foil or plate and the thin-wall body of the mixture, it is necessary to conduct heat contact bonding using a hot press, a hot roll, etc. Although adequate adhesion may be obtained at a heating temperature of 300° C. or below, where heat resistance is required, it is preferred to effect contact bonding at as high temperature as possible (generally from 200° to 300° C.). By heating and contact bonding at a temperature from 10° to 20° C. higher than the required heat resistant temperature, a laminate having excellent heat resistance and adhesion may be obtained.

A second process comprises applying a process generally employed for the production of multi-layered laminates.

That is, the thin-wall body of the mixture obtained above is provisionally bonded uniformly to the electrically conductive metal foil with or without the auxiliary layer(s) at a temperature of 120° to 250° C. and subsequently heated and pressure-treated at a temperature of 250° C. or higher. In this process, it is known that a multi-layer formation is possible by provisionally bonding one layer upon another to laminate all the layers, and finally heating and pressure-treating the laminate.

For producing layer B, i.e., the electrically conductive metal layer, of the printed board of this invention by the non-electrolytic plating (i.e., by chemical plating) or deposition, layer A or a laminate composed of layer A and the auxiliary layers C, D, E and F is prepared, and an electrically conductive metal is chemically plated or deposited thereon as described above.

Furthermore, for forming layer E, i.e., the metal layer, by non-electrolytic plating or deposition, procedures similar to those described above may be conducted. II. Bending, Drawing and Circuit Forming Methods Representative methods for providing the thus obtained printed board with bending or drawing are described below.

In general, it is preferred to etch the copper foil to form a circuit and thereafter provide bending or drawing, but it is also possible to provide such processing before etching if the copper foil, etc., does not come off during the subsequent etching step.

For bending, for example, generally practiced V bending, U bending, end bending, corrugation, elongation bending, etc. may be practiced, and the board laid on a die is processed using a punch. On this occasion, it is necessary to use a soft material as the punch because the punch slides on the board surface and otherwise sometimes leaves scratches.

For drawing, cylindrical drawing, square cylindrical drawing, and double drawing may be practiced, and since the part where the central part is pressed by the punch and accordingly the flange part is compressed in the cylindrical direction and also contacted locally with the tensile die in the radius direction receives forces such as bending, reverse bending, etc., it is important, when deep drawing, to conduct processing or design the circuit so that the circuit section is not subjected to such forces by taking the circuit pattern into consideration. Conventional aluminum bending and drawing may be conducted.

Now, representative examples of the method of forming a circuit are described below.

There is also a feature that the so-called full addition method which involves forming a circuit by non-electrolytic copper plating or deposition on the surface or the inner surface of the through-holes of the thin-wall body may be employed or an etching step may be employed as with the copper-lined laminate. Although, as the insulating material used in the full additive method, that coated with an adhesive on the surface is generally used, the thin-wall body obtained from copolymer (1) and copolymer (2) of this invention has excellent adhesion with non-electrolytic copper plating or deposit even without the use of an adhesive. Further, it is possible to form a conductor circuit by the convention circuit forming method. As an example, the thin-wall body is cut to the predetermined size and hole making is effected (any of punching, drilling, and pressing may be employed). Thereafter, the pattern formation may be effected by firstly masking the unnecessary part by screen printing or with a photosensitive agent, then subjecting this masked thin-wall body to non-electrolytic copper plating or deposition to give a copper plating or form a metal deposit film to the predetermined thickness on the unmasked part, thereby forming a desired pattern. The mask printing agent or the photosensitive agent must have excellent alkali resistance since they are dipped in the non-electrolytic plating or the mask printing for a prolonged time.

It is usually practiced to form a layer having combined functions as a photosensitive agent and as an adhesive used in the commonly practiced full additive method, and then expose this layer to light, thereby rendering exclusively the circuit part susceptible to bonding, non-electrolytic copper plating or deposit film formation. However, with the printed circuit boards of this invention, it is not necessary to employ these, and since a non-electrolytic plating layer or a deposited metal film layer is directly formed on the surface of the thin-walled body with good adherence and adhesion, not only it is suitable for the mass-production mode, but also precise circuit formation is possible without exhibiting defects (generation of whiskers, disconnections in the pattern, etc.) by ordinary etching. After such plating or deposition, it is also possible to plate gold, tin, a soldering alloy, etc., in order to prevent corrosion for the protection of the circuit, or in order to mold IC chips.

While the printed circuit boards of this invention may be subjected to any of the adhesive printing method, adhesive photographic method and direct printing method conducted by the full additive method, they are featured by that the direct printing method is also possible.

As the method of providing the through-hole part with non-electrolytic plating or non-electrolytic plating and electric plating, or metal deposition, various methods are known. Representative methods therefor include:

(1) a panel plating method which comprises making holes on a plate-formed material laminated with a copper foil, forming a copper thin film within the through-holes by non-electrolytic copper plating, then plating the entire surface by electrolytic copper plating so as to make the hole innerwall have the predetermined copper plating thickness, then providing resist plating an organic resist corresponding to a desired circuit, and finally etching the unnecessary copper by etching;

(2) a pattern plating method which comprises making holes, forming a copper thin film in the through-holes by non-electrolytic copper plating or electric copper plating, then covering the part other than the pattern part with an organic resist, forming a circuit part to the predetermined copper plating thickness by electric copper plating, providing the surface with an electric plating which can stand etching, then removing the organic resist, and dissolving and removing the unnecessary copper by etching by utilizing the plating resist as the etching resist;

(3) a tenting method which comprises forming a through-hole plating in the same manner to that in the above-described panel plating method, forming a positive pattern with an organic photosensitive film to seal the through-holes from both sides with this photosensitive film so that on removing the unnecessary copper foil by etching, the etching solution cannot penetrate into the through-holes and corrode the through-hole plating, etc. By these methods, through-hole plated printed circuit boards may be produced.

III. Printed Circuit Boards

Printed circuit boards according to this invention are described by referring to the accompanying drawings.

FIG. 1 is an enlarged cross-sectional view of a part of a printed circuit board which comprises an electrically conductive metal layer 1 (corresponding to layer B) and a crosslinked thin-wall body of copolymer (1) and copolymer (2) (hereinafter referred to as an E—E resin).

Figure 2:
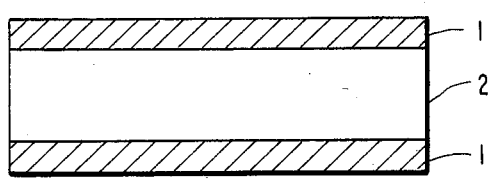

FIG. 2 is an enlarged cross-sectional view of a part of a representative example of a double-faced metal-lined printed circuit board of a structure of the printed circuit board of FIG. 1 further provided with an electrically conductive metal foil 1 on the other surface of the crosslinked thin-wall body 2.

Figure 3:
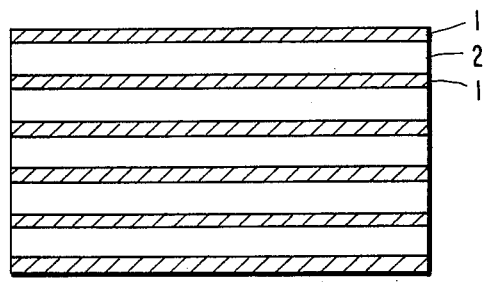

FIG. 3 is an enlarged cross-sectional view of a part of a representative example of a multi-layered printed circuit board of the structure of a laminate of single-faced and double faced metal-lined printed circuit boards as illustrated in FIG. 1 and FIG. 2.

Figure 4:
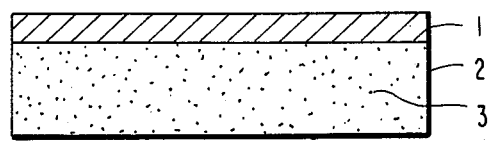

FIG. 4 is an enlarged cross-sectional view of a part of a representative example of a printed circuit board which comprises an electrically conductive metal layer 1 (i.e., a layer B) and an E—E resin 2 containing an inorganic filler 3.

Figure 5:
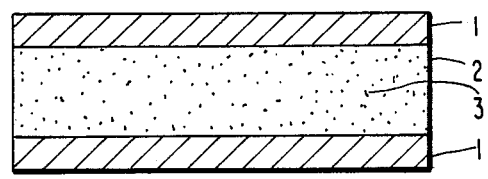

FIG. 5 is an enlarged cross-sectional view of a part of a representative example of a printed circuit board of the structure of the printed board of FIG. 4 further provided with an electrically conductive metal foil 1 on the other surface.

Figure 6:
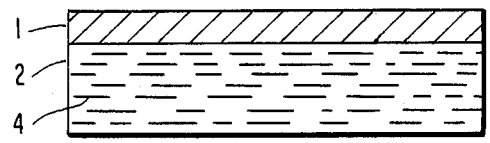

FIG. 6 is an enlarged cross-sectional view of a part of a representative example of a printed circuit board which comprises an electrically conductive metal layer 1 and an E—E resin 2 contaninined glass fibers 4.

Figure 7:
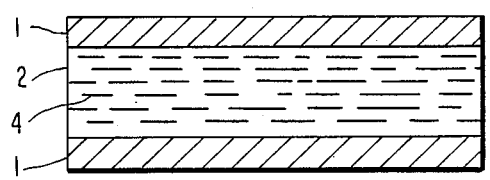

FIG. 7 is an enlarged cross-sectional view of a part of a representative example of a double-faced metal-lined printed circuit board of the structure of the printed circuit board of FIG. 6, further provided with an electrically conductive metal foil 1 on the other surface.

Figure 8:
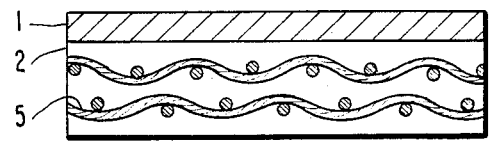

FIG. 8 is an enlarged cross-sectional view of a part of a representative example of a printed circuit board which comprises an electrically conductive metal foil 1 (i.e., a layer B) and an E—E resin 2 containing glass cloth 5.

Figure 9:
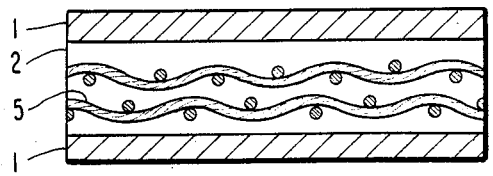

FIG. 9 is an enlarged cross-sectional view of a part of a representative example of a double-faced metal-lined printed circuit board of the structure of the printed circuit board of FIG. 8 further provided with an electrically conductive metal foil 1 on the other surface.

Figure 10:
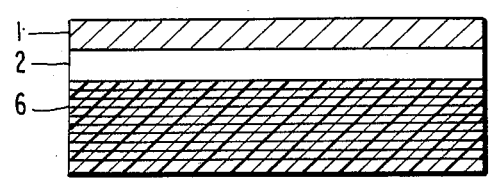

FIG. 10 is an enlarged cross-sectional view of a part of a representative example of a printed circuit board of a structure obtained by bonding an E—E resin 2 between an electrically conductive metal foil 1 and a thermosetting resin plate 6 by heating and contact bonding.

FIG. 11 is an enlarged cross-sectional view of a part of a representative example of a double-faced metal-lined printed board of a structure of the printed circuit board of FIG. 10 further provided with a second electrically conductive metal foil 1.

FIG. 12 is an enlarged cross-sectional view of a part of a representative example of a multi-layered of a multi-layered printed circuit board of a structure of a laminate of the single-faced and double-faced metal-lined printed circuit boards of FIGS. 10 and 11.

FIG. 13 is an enlarged cross-sectional view of a part of a representative example of a printed circuit board of a structure obtained by bonding an E—E resin 2 between an electrically conductive metal foil 1 and a heat-resistant thermoplastic resin plate 7 by heating and contact bonding.

FIG. 14 is an enlarged cross-sectional view of a part of a representative example of a printed circuit board of a structure obtained by bonding an E—E resin 2 between an electrically conductive metal foil 1 and a metal foil or metal plate 8 by heating and contact bonding.

FIG. 15 is an enlarged cross-sectional view of a part of a representative example of a printed circuit board obtained by bending the printed circuit board of FIG. 14.

FIG. 16 is an enlarged cross-sectional view of a part of a representative example of a printed circuit board obtained by drawing the printed circuit board of FIG. 14.

FIG. 17 is an enlarged cross-sectional view of a part of a representative example of a printed circuit board of a structure obtained by bonding an E—E resin 2 containing an inorganic filler 3 between an electrically conductive metal foil 1 and a thermosetting resin plate 6 by heating and contact bonding.

FIG. 18 is an enlarged cross-sectional view of a part of a representative example of a printed circuit board of a structure obtained by bonding an E—E resin 2 containing a glass cloth 5 between an electrically conductive metal foil 1 and a thermosetting resin plate 6 by heating and contact bonding.

FIG. 19 is an enlarged cross-sectional view of a part of a representative example of a modification of the printed circuit board of FIG. 17, wherein the thermosetting resin plate is replaced by a heat resistant-thermoplastic resin plate 7.

FIG. 20 is an enlarged cross-sectional view of a part of a representative example of a modification of the printed circuit board of FIG. 18, wherein the thermosetting resin plate is replaced by a heat-resistant thermoplastic resin plate 7.

Figure 21:
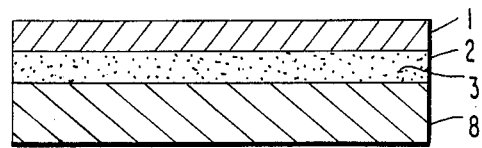

FIG. 21 is an enlarged cross-sectional view of a part of a representative example of a modification of the printed circuit board of FIG. 17, wherein the thermosetting resin plate is replaced by a metal foil or metal plate 8.

Figure 22:
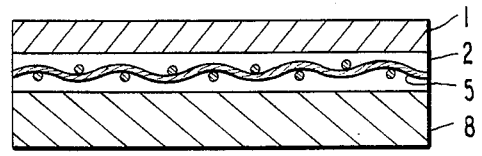

FIG. 22 is an enlarged cross-sectional view of a part of a representative example of a modification of the printed circuit board of FIG. 18, wherein the thermosetting resin plate is replaced by a metal foil or metal plate 8.

Figure 23:
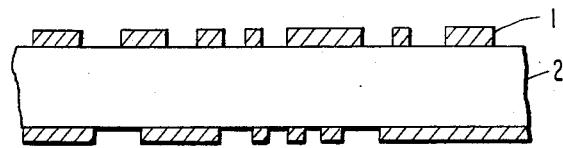
FIG. 23 is a cross-sectional view of the double-faced copper-lined printed board of FIG. 2 etched to form a circuit.

FIG. 23 is an enlarged cross-sectional view of a part of a representative example of the double-faced copper-lined printed circuit board of FIG. 2, particularly illustrating etching to form a circuit such as by conventional copper etching treatment.

Figure 24:
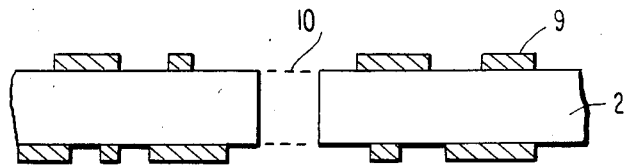
FIGS. 24 (a), (b), and (c) are schematic views illustrating a procedure for forming a circuit on a double-faced through-hole board according to this invention.
Figure 24:
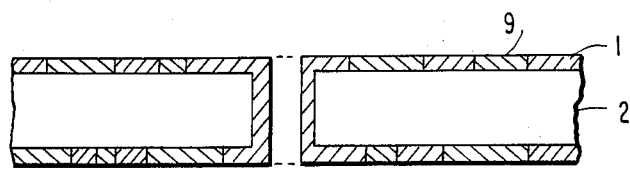
Figure 24:
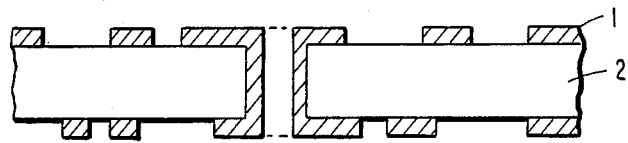

FIGS. 24(a), (b) and (c) are schematic cross-sectional views, illustrating steps in a procedure for forming a circuit on a double-faced through-hole board, wherein (a) shows the state wherein the parts other than that intended for the circuit formation have been masked with a masking agent 9, (b) shows the state where both surfaces have been covered with an electrically conductive metal, e.g., by non-electrolytic copper plating, deposition sputtering, etc., and (c) shows the state where the mask has been removed, whereby the circuit is formed.

The numerals used in the drawings are further defined as follows:

1 is an electrically conductive metal foil;
2 is a crosslinked thin-wall body of (1) at least one of an ethylene-acrylic acid copolymer and an ethylene-methacrylic acid copolymer and (2) a saponified product of an ethylene-vinyl acetate copolymer (E—E resin);
3 is an inorganic filler;
4 is a glass fiber;
5 is a glass cloth or mat;
6 is a thermosetting resin plate;
7 is a heat resistant thermoplastic resin plate;
8 is a metal foil or metal plate;
9 is a masking agent; and
10 is a through-hole part.

In accordance with this invention, since it is not necessary to further employ an adhesive conventionally used between the electrically conductive metal foil (layer B) and the resin layer (layer A) or between such a metal foil and the layer C, D, E, or F, not only is the step of coating an adhesive eliminated, but also blisters due to volatile matters (e.g., organic solvents) contained in the adhesive are not generated during heating. Further, on forming a thin-wall body and on heating and contact bonding, the insulating adhesive resin layer exhibiting thermoplasticity is cross-linked by the high temperature and pressure treatment and becomes a crosslinked thin-wall body, and therefore it is advantageous in that it has flexibility, extremely improved heat resistance, etc.

Further, when the E—E resin used in this invention, since the bond strength of the non-electrolytic copper by the through-hole plating is excellent, a precise pattern may be obtained as compared with conventional copper-lined boards of, e.g., glass—epoxy resin type, paper—phenolic resin type, polyimide film, polyester film, etc., and even when mass-production is conducted, products of stabilized quality may be obtained. In addition, since the E—E resin is flexible, no whiskers are generated and the thickness and precision of the plating may be uniformly established. Furthermore, in the field requiring no flexibility, by laminating an ordinary glass base cloth as an intermediate layer, a method for improving the hardness and the dimensional change may also be applied. These methods do not substantially lower the adherence of the non-electrolytic plating of this invention.

As described above, the printed circuit boards obtained according to this invention not only have good heat resistance, but also have remarkably improved reliability of electrically insulating properties, and moreover have crosslinking ability and adhesion on pressure-treating at high temperatures, which have been inverted based on an idea completely different from the concept in the conventional heat resistant polymer industry.

Having now generally described the invention, a further understanding can be attained by reference to certain specific Examples, which are provided herein for purposes of illustration only, and are not intended to be limiting in any manner.

In the Examples and Comparative Examples the test for heat resistance was conducted by floating the film obtained in a copper-lined printed board having a test pattern shown in UL 796 (Printed Circuit Boards) FIG. 7.1 in a soldering bath of lead/tin=55/45 (weight ratio) maintained at 220° C. and a soldering bath of lead/tin=90/10 (weight ratio) maintained at 300° C. for a predetermined period of time. The evaluation is expressed as follows:

A: Kept the original form, showing no change.
B: Although no change is observed in appearance, the peeling strength of the copper foil was reduced to the half.
X: Changes such as peel-off, cracking, breaking, separation, etc., were observed between the base insulating material and the adjacent layer and/or within the copper circuit.

In the Examples and Comparative Examples, as described hereinbelow, films formed by using mixture obtained by mixing an ethylene-acrylic acid copolymer or an ethylene-methacrylic acid copolymer with a saponified product of an ethylene-vinyl acetate copolymer were used. These were prepared as described below.

100 parts by weight of an ethylene-acrylic acid copolymer (density 0.954 g/cm$^3$, acrylic acid copolymerization proportion 20% by weight: hereinafter referred to as "EEA") having a melt flow index (as measured according to ASTM D-1238 under the conditions of a temperature of 190° C. and a load of 2.16 kg; hereinafter referred to as "M.I.") of 300 g/10 min and 100 parts by weight of a saponified product (degree of saponification 97.5%; M.I. 75 g/10 min, density 0.951 g/cm$^3$: hereinafter referred to as "saponified product") obtained by saponifying an ethylene-vinyl acetate copolymer having a vinyl acetate copolymerization proportion of 28% by weight were dry blended using a Henschel mixer for 5 minutes. The obtained mixture is hereinafter referred to as "Mixture (A)".

Further, another mixture (hereinafter referred to as "Mixture (B)") was prepared by procedures analogous to those above, except that the ethylene-acrylic acid copolymer used on producing the Mixture (A) was replaced by an ethylene methacrylic acid copolymer (density 0.950 g/cm$^3$, methacrylic acid copolymerication proportion 25% by weight) having an M.I. of 200 g/10 min.

When Mixtures (A) and (B) were subjected to extraction in a boiled toluene for three hours, the amounts of residue were 0.79% by weight and 0.80% by weight, respectively, based on the weight of mixture.

EXAMPLES 1-4 AND COMPARATIVE EXAMPLES 1-5

Sheets of 1 mm in thickness were formed using Mixture (A), Mixture (B), EEA or the saponified product with an extruder equipped with a T-die (diameter 40 mm, die width 30 cm, rotation 85 rpm) under the temperature conditions set forth in Table 1 and taken by a water-cooled roll at 20° C. The obtained respective sheets were laminated with electrolytic copper foils (35 μm in thickness) using a hot press at 340° C. for 10 minutes at 20 kg/cm$^2$ (gauge pressure) as shown in FIG. 1, and printed circuit boards were produced using the laminates, respectively. The properties of the obtained respective sheets and the results of the heat resistance test are set forth in Table 1. Further, the cross-linking degrees of the sheet (thin-wall body) before and after the lamination (i.e., before and after the heating and pressure-treating) were measured in terms of amounts of residue having a size of 0.1 μm or more when extracted in a boiled toluene for three hours, and the results are also set forth in Table 1.

With the boards obtained in Examples 1 to 4, the conductor circuits of the copper foils did not show disconnection, loosening, or detachment from the sheet. In Comparative Examples 1 to 3, since the adhesion with the copper foil was poor, it was impossible to produce the printed circuit boards for the heat resistance test. Further, in Comparative Examples 4 and 5, the conductor circuits became detached in the heat resistance test.

TABLE 1

| Example or Comparative Example No. | Kind of Mixture, Etc. | Cylinder Temperature C$_1$ (°C.) | Cylinder Temperature C$_2$ (°C.) | Die Temperature D (°C.) | Properties of Sheet before Lamination | Heat Resistance Test 300° C., 3 min | Cross-Linking Degree of Sheet Before Lamination (wt %) | Cross-Linking Degree of Sheet After Lamination (wt %) |
|---|---|---|---|---|---|---|---|---|
| Example | | | | | | | | |
| 1 | Mixture (A) | 120 | 140 | 140 | Good film without gels or foaming | A | 0.79 | 97.0 |
| 2 | " | " | " | 160 | Good film without gels or foaming | A | 0.79 | 98.2 |
| 3 | " | " | 160 | 240 | Good film without gels or foaming | A | 0.79 | 98.6 |
| 4 | Mixture (B) | " | 140 | 160 | Good film without gels or foaming | A | 0.80 | 97.8 |
| Comparative Example 1 | | | | | | | | |
| 1 | Mixture (A) | " | 200 | 260 | Gels generated | * | 58 | * |
| 2 | " | " | 240 | 300 | Gels and foams generated | * | 85 | * |
| 3 | " | " | " | 330 | Gels abundantly formed, molding difficult | * | 98 | * |
| 4 | EAA | " | 140 | 140 | Good film | x | — | — |
| 5 | Saponified product | " | " | " | " | x | — | — |

*Not measured because printed circuit boards could not be obtained.

EXAMPLES 5-9 AND COMPARATIVE EXAMPLES 6-8

The inorganic powders (inorganic fillers) set forth in Table 2 were mixed into the aforesaid Mixture (A), Mixture (B), EAA and the saponified product by dry blending using a Henschel mixer for 5 minutes and thereafter extruded using conditions similar to those in Example 3 to produce sheets (1.0 mm in thickness).

The inorganic fillers used herein were boron nitride (thermal conductivity 35 Kcal/m.hr.°C., volume resistivity $10^{14}$ Ω.cm, hereinafter referred to as "BN") having an average particle diameter of 1.5 μm, calcium carbonate (thermal conductivity 1.0 Kcal/m.hr.°C., volume resistivity $10^{14}$ Ω.cm, hereinafter referred to as "CaCO$_3$") having an average particle diameter of 5.0 μm and alumina (volume resistivity $10^{16}$ Ω.cm, hereinafter referred to as "Al$_2$O$_3$") having an average particle diameter of 3.0 μm.

The obtained respective sheets were laminated with electrolytic copper foils (35 μm in thickness) by using a hot press for 10 minutes at 20 kg/cm$^2$ (gauge pressure), and printed boards as shown in FIG. 4 were produced. The properties and the heat resistance test results of the respective sheets are given in Table 2. In Comparative Examples 6 and 7, the adhesion with the copper foil was inadequate and it was impossible to use them as printed circuit boards.

TABLE 2

| Example or Comparative Example No. | Kind of Mixture, Etc. | Inorganic Filler Kind | Inorganic Filler Amount Added (wt %) | Properties of Sheet before Lamination | Heat Resistance Test 300° C., 3 Min. |
|---|---|---|---|---|---|
| Example | | | | | |
| 5 | Mixture (A) | BN | 20 | Good | A |
| 6 | " | CaCO$_3$ | 40 | " | A |
| 7 | " | Al$_2$O$_3$ | 40 | " | A |
| 8 | " | Al$_2$O$_3$ | 60 | " | A |
| 9 | Mixture (B) | Al$_2$O$_3$ | 40 | " | A |
| Comparative Example | | | | | |
| 6 | EAA | Al$_2$O$_3$ | 40 | Good | A |
| 7 | Saponified product | Al$_2$O$_3$ | 40 | " | x |
| 8 | Saponified product | BN | 20 | Gels formed, sheet forming impossible (cross-linking degree: 70 wt %) | * |

*Not measured

EXAMPLES 10-19 AND COMPARATIVE EXAMPLES 9-13

The resin or mixture and glass fiber set forth in Table 3 were dry blended using the amount added set forth in Table 3 in a Henschel mixer for 5 minutes. The obtained respective mixtures were extruded using an extruder equipped with a T-die (diameter 40 mm, die width 30 mm, rotation 85 rpm) at the same cylinder temperature and die temperature as those in Example 3 to form sheets (500 μm in thickness). The thus obtained respective sheets were cross-linked by using a hot press at 340° C. at 20 kg/cm$^2$ (gauge pressure) for 10 minutes to product sheets. The obtained sheets were tested for the heat resistance. The results are given in Table 3.

The sheet obtained in Example 12 was measured for the volume resistivity, dielectric constant (1 MHz), dielectric loss tangent and withstand voltage according to ASTM D-257.

The voltage resistivity was $10^{15}$ Ω.cm, the dielectric constant was 2.9, the dielectric loss tangent was 0.02 and the withstand voltage was 25 kV/mm.

It is clear from the results of Table 3 that the thin-wall body of this invention has not only excellent heat resistance but also good electrical insulating properties and thus is very useful for printed circuit boards.

TABLE 3

| Example or Comparative | Kind of | Glass Fiber Amount Added | Length | Heat Resistance Test |
|---|---|---|---|---|

| Example No. | Mixture, Etc. | (wt %) | (mm) | 300° C., 3 Min. |
|---|---|---|---|---|
| Example | | | | |
| 10 | Mixture (A) | 50 | 2 | A |
| 11 | " | " | 5 | A |
| 12 | " | " | 10 | A |
| 13 | " | " | 30 | A |
| 14 | " | 10 | 5 | A |
| 15 | " | 20 | " | A |
| 16 | " | 100 | " | A |
| 17 | " | 150 | " | A |
| 18 | Mixture (B) | 50 | " | A |
| 19 | " | 100 | 10 | A |
| Comparative Example | | | | |
| 9 | Mixture (A) | 0 | — | A |
| 10 | " | 2 | 5 | A |
| 11 | " | 300 | " | A |
| 12 | EAA | 50 | " | x |
| 13 | Saponified product | " | " | x |

EXAMPLES 20-24 AND COMPARATIVE EXAMPLES 14-18

Films (200 μm in thickness) obtained analogously to that of Examples 1 to 4 and Comparative Examples 1 to 5 were overlaid with a copper foil of 35 μm in thickness on top and a glass fabric of 400 g/m² (hereinafter referred to as "Mat"), a cloth of 400 g/m² (hereinafter referred to as "Cloth (1)") as a plain weave glass cloth or a 6-layered cloth (hereinafter referred to as "Cloth (2)") obtained by overlaying 6 cloth to 600 g/m², each being of 100 g/m², on bottom, and cross-linked at 250° C. or 320° C. using a hot press at 20 kg/cm² (gauge pressure) for 10 minutes to laminate the aforesaid film to a thickness of 1.6 mm, and thereby printed circuit boards were produced. The obtained respective boards were tested for the heat resistance under the aforesaid conditions.

Since the printed circuit boards obtained in Examples 20 to 24 were prepared in such way that the film melts to impregnate the glass cloth or mat and thereafter it undergoes the condensation reaction while bonding to the copper foil, it was possible to produce flexible printed circuit boards uniformly filled with the glass cloth or mat without the use of an adhesive.

For comparison, a heat resistance test similar to the above was conducted using a commercially available phenolic resin paper-based copper-linked laminate in Comparative Example 17 and a commercially available epoxy resin-impregnated glass cloth-based copper-lined laminate in Comparative Example 18. The results of the heat resistance test are set forth in Table 4.

TABLE 4

| Example or Comparative Example No. | Kind of Mixture, Etc. | Die Temperature (°C.) | Kind of the Glass Cloth or Mat | Bonding Temperature (°C.) | Heat Resistance Test (3 min.) 220° C. | 300° C. |
|---|---|---|---|---|---|---|
| Example | | | | | | |
| 20 | Mixture (A) | 140 | Mat | 250 | A | x |
| 21 | " | 160 | " | 320 | A | A |
| 22 | " | 180 | Cloth (1) | 250 | A | A |
| 23 | Mixture (B) | 140 | " | 320 | A | A |
| 24 | " | " | Cloth (2) | " | A | A |
| Comparative Example | | | | | | |
| 14 | Mixture (A) | 140 | Not used | 320 | A | A |
| 15 | EAA | " | Cloth (1) | 250 | x | x |
| 16 | Saponified product | " | " | " | x | x |
| 17 | Phenolic resin paper-based Cu-lined | | | | A | x |
| 18 | Epoxy resin impregnated glass cloth base | | | | A | x |

The film of 200 μm in thickness obtained in Example 22 was measured for the volume resistivity, dielectric constant (1 MHz), dielectric loss tangent and withstand voltage.

The volume resistivity was $10^{14}$ Ω.cm, the dielectric constant was 3.6, the dielectric loss tangent was 0.08 and the withstand voltage was 15 KV/mm.

EXAMPLES 25-30 AND COMPARATIVE EXAMPLES 19-21

Films (100 μm in thickness) obtained analogously to that of Examples 1 to 4 (or as in Comparative Examples 1 and 2 for Comparative Examples 19 and 20) were laminated with an electrolytic copper foil (17 μm in thickness) and a base board at 250° C. or 320° C. by a hot press at 20 kg/cm² (gauge pressure) for 10 minutes, as shown in FIG. 10, to produce each printed circuit board. The results of the heat resistance test on the printed circuit boards bonded (laminated) are set forth in Table 5. In Examples 25 to 30 and Comparative Examples 19 and 20, the films obtained in Examples 1, 2, 3, 4, 3 and 3 and Comparative Examples 1 and 2 were used as an adhesive layer, respectively, while in Comparative Example 21, a conventionally used epoxy resin (adhesive) was used.

In the column "Base Board" in Table 5, "A" stands for a commercially available epoxy resin glass cloth base (product corresponding to JIS C-6484 GE4), and "B" stands for a paper-based phenolic resin laminate (product corresponding to JIS C-6485 PP7F). "C" stands for a paper-based epoxy resin laminate (product corresponding to JIS C-6482) and "D" stands for a commercially available product of the same base as "A", but further lined with copper.

TABLE 5

| Example or Comparative Example No. | Base Board | Bonding Temperature (°C.) | Heat Resistance Test (3 min.) 220° C. | 300° C. |
|---|---|---|---|---|
| Example | | | | |
| 25 | A | 250 | A | x |
|  |  | 320 | A | A |
| 26 | " | 250 | A | x |
|  |  | 320 | A | A |
| 27 | " | 250 | A | A |
|  |  | 320 | A | A |
| 28 | " | 250 | A | A |
|  |  | 320 | A | A |
| 29 | B | 250 | A | B |
|  |  | 320 | A | A |
| 30 | C | 250 | A | B |
|  |  | 320 | A | A |
| Comparative Example | | | | |
| 19 | A | 250 | x | x |
|  |  | 320 | x | x |
| 20 | " | 250 | x | x |
|  |  | 320 | x | x |
| 21 | D | — | A | x |

The film obtained in Example 25 was measured for the volume resistivity, dielectric constant (1 MHz), dielectric loss tangent and withstand voltage according to ASTM D-257.

The volume resistivity was $10^{14}$ Ω.cm, the dielectric constant was 3.5, the dielectric loss tangent was 0.2 and the withstand voltage was 20 KV/mm.

It is clear from the above results that the cross-linked product (thin-wall body obtained by heating and pressure-treating the mixture) of this invention has not only good adhesion between the copper foil and the thermosetting resin base, but also excellent heat resistance and good electrical insulating properties, and therefore can be used as an adhesive for thermosetting resin-based circuit boards.

EXAMPLES 31–34 AND COMPARATIVE EXAMPLES 22–26

Copper foil-laminated film obtained by laminating each film with an electrolytic copper foil (35 μm in thickness) using a laminate extruder equipped with a T-die under the conditions set forth in Table 6 was laminated with a polyimide film (trademark "Kapton" produced by du Pont, 25 μm in thickness) at 250° C. or 300° C. by a hot press at 20 kg/cm² (gauge pressure) as shown in FIG. 13, to produce each printed circuit board. The properties of the copper foil-laminated films obtained above are set forth in Table 6. Further, the results of the heat resistance test of the printed circuit boards bonded (laminated) are set forth in Table 7.

TABLE 6

| Example or Comparative Example No. | Kind of Mixture, Etc. | Cylinder Temperature $C_1$ (°C.) | $C_2$ (°C.) | Die Temperature D (°C.) | Properties of the Film |
|---|---|---|---|---|---|
| Example | | | | | |
| 31 | Mixture (A) | 120 | 140 | 140 | Good film without gels or foaming |
| 32 | " | " | " | 160 | Good film without gels or foaming |
| 33 | " | " | 160 | 240 | Good film without gels or foaming |
| 34 | Mixture (B) | " | 140 | 160 | Good film without gels or foaming |
| Comparative Example | | | | | |
| 22 | Mixture (A) | " | 200 | 260 | Gels generated |
| 23 | " | " | 240 | 300 | Gels and foams generated |
| 24 | " | " | " | 330 | Gels abundantly formed, molding difficult |
| 25 | EAA | " | 140 | 140 | Good film |
| 26 | Saponified product | " | " | " | " |

TABLE 7

| Example or Comparative Example No. | Bonding Temperature (°C.) | Heat Resistance Test (3 min.) 220° C. | 300° C. |
|---|---|---|---|
| Example | | | |
| 31 | 250 | A | B |
|  | 300 | A | A |
| 32 | 250 | A | B |
|  | 300 | A | A |
| 33 | 250 | A | B |
|  | 300 | A | A |
| 34 | 250 | A | B |
|  | 300 | A | A |
| Comparative Example | | | |
| 25 | 250 | x | x |
|  | 300 | x | x |
| 26 | 250 | x | x |
|  | 300 | x | x |

The film obtained in Example 33 was measured for the volume resistivity, dielectric constant (1 MHz), dielectric loss tangent and withstand voltage, according to ASTM D-257.

The volume resistivity was $10^{14}$ Ω.cm, the dielectric constant was 3.8, the dielectric loss tangent was 0.08, and the withstand voltage was 10 KV/mm.

It is clear from the above results that the thin-wall body of this invention has not only excellent adhesion to the copper foil and the polyimide film but also excellent heat resistance and good electrical insulating properties, and therefore can be used as an adhesive for polyimide film-based flexible printed circuit boards.

EXAMPLES 35–38 AND COMPARATIVE EXAMPLES 27–31

Films (50 μm in thickness) obtained analogously to those of Examples 1 to 4 and Comparative Examples 1 to 5 were laminated with an electrolytic copper foil (17 μm in thickness) and a polyester film (trademark "Mylar", produced by du Pont, 50 μm in thickness) at 250°

C. by a hot press at 20 kg/cm² (gauge pressure) for 10 minutes as shown in FIG. 13 to produce each printed circuit board. The properties of the thus obtained films are given in Table 8. Further, when a heat resistance test was conducted on the printed boards bonded (laminated) at 250° C., no change was observed with any of those obtained in Examples 35 to 38, whereas with those obtained in Comparative Examples 30 and 31, such changes as peel-off, cracking, separation, etc., were observed between the polyester film and the adjacent layer, and within the copper circuit layer.

EXAMPLES 39–45 AND COMPARATIVE EXAMPLES 32–35

Films obtained analogously to those of Examples 1 to 4 and Comparative Examples 1 to 5 were overlaid with a copper foil of 35 μm in thickness and further with a metal foil as set forth in Table 9, and cross-linked at 320° C. using a hot press under a pressure of 20 kg/cm² (gauge pressure) for 10 minutes to produce metal foil-reinforced flexible printed circuit boards. A heat resistance test was conducted on each of the films obtained.

TABLE 8

| Example or Comparative Example No. | Kind of Mixture, Etc. | Cylinder Temperature $C_1$ (°C.) | $C_2$ (°C.) | Die Temperature D (°C.) | Properties of the Film |
|---|---|---|---|---|---|
| Example | | | | | |
| 35 | Mixture (A) | 120 | 140 | 140 | Good film without gels or foaming |
| 36 | " | " | " | 160 | Good film without gels or foaming |
| 37 | " | " | 160 | 240 | Good film without gels or foaming |
| 38 | Mixture (B) | " | 140 | 160 | Good film without gels or foaming |
| Comparative Example | | | | | |
| 27 | Mixture (A) | " | 200 | 260 | Gels generated |
| 28 | " | " | 240 | 300 | Gels and foams generated |
| 29 | " | " | " | 330 | Gels abundantly formed, molding difficult |
| 30 | EAA | " | 140 | 140 | Good film |
| 31 | Saponified product | " | " | " | " |

The film obtained in Example 37 was measured for the volume resistivity, dielectric constant (1 MHz), dielectric loss tangent and withstand voltage according to ASTM D-257.

The volume resistivity was $10^{16}$ Ω.cm, the dielectric constant was 3.8, the dielectric loss tangent was 0.02 and the withstand voltage was 10 KV/mm.

It is clear from the above results that the thin-wall body of this invention not only has excellent adhesion to the copper foil and the polyester film, but also excellent heat resistance and good electrical insulating properties, and therefore can be used as an adhesive for polyester film-based flexible printed circuit boards.

The results are set forth in Table 9. The printed circuit boards obtained in Examples 39 to 45 could be wound round a rod of 2 cm in diameter, and no abnormality was observed even after repeating this operation several times. However, the printed circuit boards obtained in Comparative Examples 32 and 33 could not be wound round the aforesaid rod. Further, when the printed circuit boards obtained in Comparative Examples 34 and 35 were wound round the aforesaid rod, peel-off was observed between the metal foil and the thin-wall body.

The film obtained in Example 41 was measured for the volume resistivity, dielectric constant (1 MHz), dielectric loss tangent and withstand voltage according to ASTM D-257.

The volume resistivity was $10^{16}$ Ω.cm, the dielectric constant was 2.8, the dielectric loss tangent was 0.08 and the withstand voltage was 30 KV/mm.

TABLE 9

| Example or Comparative Example No. | Mixture, Etc. Kind | Thickness (μm) | Metal Foil Kind | Thickness (μm) | Heat Resistance Test 300° C., 3 Min. |
|---|---|---|---|---|---|
| Example | | | | | |
| 39 | Mixture (A) | 60 | Aluminum foil | 10 | A |
| 40 | " | " | " | 30 | A |
| 41 | " | " | " | 60 | A |
| 42 | " | " | Copper foil | 30 | A |
| 43 | " | " | " | 35 | A |
| 44 | " | 200 | Aluminum foil | 10 | A |
| 45 | Mixture (B) | 60 | " | 30 | A |
| Comparative Example | | | | | |
| 32 | Mixture (A) | " | Aluminum plate | 1,000 | A |
| 33 | " | " | Iron plate | 200 | A |
| 34 | EAA | " | Aluminum foil | 30 | x |
| 35 | Saponified | " | " | " | x |

TABLE 9-continued

| Example or Comparative Example No. | Mixture, Etc. | | Metal Foil | | Heat Resistance Test 300° C., 3 Min. |
|---|---|---|---|---|---|
| | Kind | Thickness (μm) | Kind | Thickness (μm) | |
| | product | | | | |

EXAMPLES 46–49 AND COMPARATIVE EXAMPLES 36 & 37

Sheets obtained analogously to those of Examples 1 to 4 and Comparative Examples 1 to 5 were provided with masking on the part other than where a circuit was to be formed using a photoresist (trademark "Ristan", produced by du Pont) according to a photoresist masking method.

Each sheet obtained was plated using a chemical plating solution having the following composition in one liter of an aqueous solution at 72° C., to obtain a copper plating of about 35 μm on both surfaces of each sheet.

$CuSO_4 \cdot 5H_2O$: 10 g
EDTA-2Na·$2H_2O$: 30 g
HCHO (36%): 3 ml
NaOH: 12 g

After the completion of the plating, each sheet was washed to remove the aforesaid masking, then washed with water, and dried.

A heat resistance test was conducted on the obtained circuit-formed boards. The results are set forth in Table 10.

TABLE 10

| Example or Comparative Example No. | Mixture, Etc. | | Heat Resistance Test |
|---|---|---|---|
| | Kind | Thickness (mm) | |
| Example | | | |
| 46 | Mixture (A) | 0.2 | A |
| 47 | " | 0.4 | A |
| 48 | " | 1.0 | A |
| 49 | Mixture (B) | " | A |
| Comparative Example | | | |
| 36 | EAA | " | x |
| 37 | Saponified product | " | x |

It is clear from the above results that the printed circuit boards obtained by this invention not only have a very high circuit density, but also have excellent heat resistance and are soft, high quality printed circuit boards.

EXAMPLES 50–53 AND COMPARATIVE EXAMPLES 38 & 39

Films obtained analogously to those of Examples 1 to 4 and Comparative Examples 1 to 5 were cross-linked at 320° C. using a hot press under a pressure of 20 kg/cm² (gauge pressure) for 10 minutes to prepare sheets (of the thickness set forth in Table 11).

The sheets obtained were plated using a chemical plating solution having the following composition in one liter of an aqueous solution at 72° C. to obtain a copper plating of about 30 μm on both surfaces of each sheet.

$CuSO_4 \cdot 5H_2O$: 10 g
EDTA-2Na·$2H_2O$: 30 g
HCHO (36%): 3 ml
NaOH: 12 g

After the plating, washing with water and drying were conducted.

The double-faced copper-lined boards obtained were subjected to etching treatment in a conventional manner to prepare circuit boards having a test pattern. A heat resistance test was also conducted on the boards obtained. The results are set forth in Table 11.

TABLE 11

| Example or Comparative Example No. | Mixture, Etc. | | Heat Resistance Test |
|---|---|---|---|
| | Kind | Thickness (mm) | |
| Example | | | |
| 50 | Mixture (A) | 0.2 | A |
| 51 | " | 0.4 | A |
| 52 | " | 1.0 | A |
| 53 | Mixture (B) | " | A |
| Comparative Example | | | |
| 38 | EAA | " | x |
| 39 | Saponified product | " | x |

It is seen from these results that printed circuit boards obtained according to this invention not only have a very high circuitry density, but also have excellent heat resistance and are soft and of a high quality.

EXAMPLES 54–57 AND COMPARATIVE EXAMPLES 40 & 41

Sheets obtained analogously to those of Examples 1 to 4 and Comparative Examples 1 to 5 were provided with masking on the part other than where a circuit was to be formed using a screen printing machine.

Platinum was deposited on the obtained sheets using a vacuum depositing device (trademark "Model JEE-4X", produced by Japan Electron Optics Lab. Co.) in $2 \times 10^{-6}$ Torr to obtain a platinum coat of about 1,000 Å in thickness.

A heat resistance test was conducted on the circuit boards obtained. The results are set forth in Table 12.

TABLE 12

| Example or Comparative Example No. | Mixture, Etc. | | Heat Resistance Test |
|---|---|---|---|
| | Kind | Thickness (mm) | |
| Example | | | |
| 54 | Mixture (A) | 0.2 | A |
| 55 | " | 0.4 | A |
| 56 | " | 1.0 | A |
| 57 | Mixture (B) | " | A |
| Comparative Example | | | |
| 40 | EAA | " | x |
| 41 | Saponified product | " | x |

It is seen from these results that the printed circuit boards obtained according to this invention not only have a very high circuit density, but also have excellent heat resistance and are soft, high-quality printed circuit boards.

EXAMPLES 58–61 AND COMPARATIVE EXAMPLES 42 & 43

Film obtained analogously to those of Examples 1 to 4 and Comparative Examples 1 to 5 were bond laminated with electrolytic copper foils (17 μm in thickness) on both surfaces as shown in FIG. 2 and cross-linked at 320° C. using a hot press under a pressure of 20 kg/cm² (gauge pressure) for 10 minutes to produce double-faced copper foil-lined laminates (of thicknesses as set forth in Table 13).

Each laminate obtained was provided with through-holes of 0.5 mm of 1.0 mm in diameter and plating was effected on the through-hole part using a non-electrolytic copper plating solution having the following composition to produce each copper plating of about 20 μm in film thickness.

CuSO$_4$.5H$_2$O: 10 g
EDTA-2Na.2H$_2$O: 30 g
HCHO (36%): 3 ml
NaOH: 12 g

After the plating, washing with water and subsequent drying were conducted. Thereafter, a circuit was formed by firstly masking the circuit part by a screen printing machine in a conventional manner and removing the part other than the circuit by etching.

A heat resistance test was conducted on the circuit boards obtained. The results are set forth in Table 13.

TABLE 13

| Example or Comparative Example No. | Mixture, Etc. Kind | Thickness (mm) | Heat Resistance Test |
|---|---|---|---|
| Example | | | |
| 58 | Mixture (A) | 0.2 | A |
| 59 | " | 0.4 | A |
| 60 | " | 1.0 | A |
| 61 | Mixture (B) | " | A |
| Comparative Example | | | |
| 42 | EAA | " | x |
| 43 | Saponified product | " | x |

It is seen from these results that the printed circuit boards obtained by this invention not only have a very high circuit density, but also have excellent heat resistance and are soft, high-quality printed circuit boards.

EXAMPLES 62–64 AND COMPARATIVE EXAMPLES 44 & 45

Films obtained analogously to those of Examples 1 to 4 and Comparative Examples 1 to 5 were overlaid with an electrolytic copper foil of 35 μm in thickness on top and an aluminum plate of the thickness set forth in Table 14 on bottom and cross-linked at 320° C. using a hot press at 20 kg/cm² (gauge pressure) for 10 minutes to produce each copper-lined board for the production of hybrid integrated circuit boards. The boards obtained were provided with etching (ammonium persulfate etching) to give a test pattern shown in UL 796 (Printed Circuit Boards) FIG. 7.1.

The boards obtained were subjected to a heat resistance test, a bending test by a V-die (groove width 70 mm, angle 90°, sample width 50 mm) and a square cylinder single-drawing test (no flange) (drawing depth 2 mm, corner radius 5 mm). The results of the heat resistance test are given in Table 14.

TABLE 14

| Example or Comparative Example No. | Kind of Mixture, Etc. | Thickness of Aluminum Plate (μm) | Heat resistance Test |
|---|---|---|---|
| Example | | | |
| 62 | Mixture (A) | 50 | A |
| 63 | " | 100 | A |
| 64 | Mixture (B) | " | A |
| Comparative Example | | | |
| 44 | EAA | " | x |
| 45 | Saponified product | " | x |

As the result of the V-bending and drawing tests, the boards for printing obtained by Examples 62 to 64 did not show any disconnection of the copper circuit and were able to be processed by V-bending and drawing. Further, no peel-off was observed at the corner. On the contrary, the board obtained in Comparative Example 44 shows peel-off at the corner part on V-bending, and when drawing, the copper foil land the aluminum separated. Further, the board obtained in Comparative Example 45 showed peel-of at the corner part on V-bending, and its cut was cut on drawing.

EXAMPLES 65–68 AND COMPARATIVE EXAMPLES 46–50

Films obtained analogously to those of Examples 1 to 4 and Comparative Examples 1 to 5 were laminated with an electrolytic copper foil (17 μm in thickness) and a polyether ether ketone film (50 μm in thickness) at 250° C. using a hot press under a pressure of 20 kg/cm² (gauge pressure) for 10 minutes as shown in FIG. 13 to produce each printed board. The properties of the films are given in Table 15. Further, when a heat resistance test was conducted on the printed circuit boards bonded (laminated) at 250° C., no change was observed with any of those obtained in Examples 65 to 68, whereas with those obtained in Comparative Examples 46 and 50, changes such as peel-off, cracking, separation, etc., were observed between the polyether ether ketone film and the adjacent layer, and within the copper circuit.

TABLE 15

| Example or Comparative Example No. | Kind of Mixture, Etc. | Cylinder Temperature C$_1$ (°C.) | Cylinder Temperature C$_2$ (°C.) | Die Temperature D (°C.) | Properties of the Film |
|---|---|---|---|---|---|
| Example | | | | | |
| 65 | Mixture (A) | 120 | 140 | 140 | Good film without gels or foaming |
| 66 | " | " | " | 160 | Good film without gels or foaming |
| 67 | " | " | 160 | 240 | Good film without gels or foaming |
| 68 | Mixture (B) | " | 140 | 160 | Good film without gels or foaming |

TABLE 15-continued

| Example or Comparative Example No. | Kind of Mixture, Etc. | Cylinder Temperature $C_1$ (°C.) | Cylinder Temperature $C_2$ (°C.) | Die Temperature D (°C.) | Properties of the Film |
| --- | --- | --- | --- | --- | --- |
| Comparative Example | | | | | |
| 46 | Mixture (A) | " | 200 | 260 | Gels generated |
| 47 | " | " | 240 | 300 | Gels and foams generated |
| 48 | " | " | " | 330 | Gels abundantly formed, molding difficult |
| 49 | EAA | " | 140 | 140 | Good film |
| 50 | Saponified product | " | " | " | " |

EXAMPLES 69–72

Printed boards were produced in a manner similar to that in Example 65 except that the polyether ether ketone film used in Example 65 was replaced by films of polytriazine, poly-p-phenylene phthalamide, polyoxymethylene, and polyether sulfone of 50 μm thickness, respectively.

Further, when the heat resistance test was conducted on the printed board bonded (laminated) at 250° C., none of them showed any change, as was the case for Example 65.

The film obtained in Example 71 was measured for the volume resistivity, dielectric constant (1 MHz), dielectric loss tangent and withstand voltage according to ASTM D-257.

The volume resistivity was $10^{16}$ Ω.cm, the dielectric constant was 3.8, the dielectric loss tangent was 0.02, and the withstand voltage was 10 KV/mm.

It is clear from the above results that the thin-wall bodies of this invention not only have excellent adhesion to the copper foil and the heat resistant polymer films, but also have excellent heat resistance and good electrical insulating properties, and therefore can be used as an adhesive for heat resistant polymer-based flexible printed circuit boards.

While the invention has been described in detail and with reference to specific embodiments thereof, it will be apparent to one skilled in the art that various changes and modifications can be made therein without departing from the spirit and scope thereof.

What is claimed is:

1. A substrate for a printed circuit board which comprises a laminate of:
   (A) a support layer having a thickness of from 3 μm to less than 5 mm which is a cross-linked product of a mixture composed of (1) at least one of an ethylene-acrylic acid copolymer and an ethylene-methacrylic acid copolymer, and (2) a saponified product of an ethylene-vinyl acetate copolymer, wherein the mixing proportion of copolymer (1) in the mixture is from 20 to 80% by weight and the mixture is cross-linked such that after extraction of the cross-linked product with a boiled toluene for three hours the amount of residue having a size of 0.1 μm or more is at least 80% by weight based on the weight of the cross-linked product, and
   (B) an electrically conductive metal layer having a thickness of from 100 Å to 400 μm.

2. A substrate for a printed circuit board as in claim 1, which further comprises
   (C) a thermosetting resin layer having a thickness of from 0.005 to 4 mm, and the electrically conductive metal layer and the thermosetting layer are laminated via said support layer.

3. A substrate for a printed circuit board as in claim 2, wherein the support layer is obtained by extruding the mixture of copolymer (1) and copolymer (2) into a support layer at a temperature of up to 250° C. under such conditions that when the extruded mixture is extracted in boiled toluene for 3 hours the amount of residue having a size of 0.1 μm or more is not more than 15% by weight based on the weight of the extruded mixture, and heating and pressure-treating the extruded mixture at a temperature of from 100° to 400° C. to effect cross-linking.

4. A substrate for a printed circuit board as in claim 3, wherein said heating and pressure-treating is carried out at a pressure of at least 5 kg/cm².

5. A substrate for a printed circuit board as in claim 2, wherein said support layer contains an inorganic filler having a thermal conductivity of $1 \times 10^{-3}$ cal/°C.cm.sec or more.

6. A substrate for a printed circuit board as in claim 2, wherein said electrically conductive metal layer is formed by metal deposition to have a thickness of from 100 Å to 100 μm.

7. A substrate for a printed circuit board as in claim 1, which further comprises
   (D) a heat resistant thermoplastic polymer layer having a glass transition temperature of 200° to 400° C. and a thickness of from 0.005 to 4 mm; and the electrically conductive metal layer and the heat resistant polymer layer are laminated via said support layer.

8. A substrate for a printed circuit board as in claim 7, wherein the support layer is obtained by extruding the mixture of copolymer (1) and copolymer (2) into a support layer at a temperature of up to 250° C. under such conditions that when the extruded mixture is extracted in boiled toluene for 3 hours the amount of residue having a size of 0.1 μm or more is not more than 15% by weight based on the weight of the extruded mixture, and heating and pressure-treating the extruded mixture at a temperature of from 100° to 400° C. to effect cross-linking.

9. A substrate for a printed circuit board as in claim 8, wherein said heating and pressure-treating is carried out at a pressure of at least 5 kg/cm².

10. A substrate for a printed circuit board as in claim 7, wherein said support layer contains an inorganic filler having a thermal conductivity of $1 \times 10^{-3}$ cal/°C.cm.sec or more.

11. A substrate for a printed circuit board as in claim 7, wherein said electrically conductive metal layer is formed by metal deposition to have a thickness of from 100 Å to 100 μm.

12. A substrate for a printed circuit board as in claim 1, which further comprises
(E) an electrically conductive metal layers, wherein the thickness of a first electrically conductive metal layer is from 100 Å to 400 μm and the thickness of a second electrically conductive metal layer is from 5 μm to 200 μm; and said electrically conductive metal layers are laminated via said support layer.

13. A substrate for a printed circuit board as in claim 12, wherein the support layer is obtained by extruding the mixture of copolymer (1) and copolymer (2) into a support layer at a temperature of up to 250° C. under such conditions that when the extruded mixture is extracted in boiled toluene for 3 hours the amount of residue having a size of 0.1 μm or more is not more than 15% by weight based on the weight of the extruded mixture, and heating and pressure-treating the extruded mixture at a temperature of from 100° to 400° C. to effect crosslinking.

14. A substrate for a printed circuit board as in claim 13, wherein said heating and pressure-treating is carried out at a pressure of at least 5 kg/cm².

15. A substrate for a printed circuit board as in claim 12, wherein said support layer contains an inorganic filler having a thermal conductivity of $1 \times 10^{-3}$ cal/°C.cm.sec or more.

16. A substrate for a printed circuit board as in claim 12, wherein said first electrically conductive metal layer is formed by metal deposition to have a thickness of from 100 Å to 100 μm.

17. A substrate for a printed circuit board as in claim 1, wherein the support layer is obtained by extruding the mixture of copolymer (1) and copolymer (2) into a support layer at a temperature of up to 250° C. under such conditions that when the extruded mixture is extracted in boiled toluene for 3 hours the amount of residue having a size of 0.1 μm or more is not more than 15% by weight based on the weight of the extruded mixture, and heating and pressure-treating the extruded mixture at a temperature of from 100° to 400° C. to effect crosslinking.

18. A substrate for a printed circuit board as in claim 17, wherein said heating and pressure-treating is carried out at a pressure of at least 5 kg/cm².

19. A substrate for a printed circuit board as in claim 1, wherein said support layer contains an inorganic filler having a thermal conductivity of $1 \times 10^{-3}$ cal/°C.cm.sec or more.

20. A substrate for a printed circuit board as in claim 1, wherein said electrically conductive metal layer is formed by metal deposition to have a thickness of from 100 Å to 100 μm.

* * * * *